US008106657B2

(12) United States Patent
Sakellariou et al.

(10) Patent No.: US 8,106,657 B2
(45) Date of Patent: Jan. 31, 2012

(54) APPARATUS FOR HIGH-RESOLUTION NMR SPECTROSCOPY AND/OR IMAGING WITH AN IMPROVED FILLING FACTOR AND RF FIELD AMPLITUDE

(75) Inventors: Dimitrios Sakellariou, Boulogne-Billancourt (FR); Jacques-François Jacquinot, Paris (FR)

(73) Assignee: Commissariat a l'Energie Atomique (FR)

( * ) Notice: Subject to any disclaimer, the term of this patent is extended or adjusted under 35 U.S.C. 154(b) by 825 days.

(21) Appl. No.: 11/993,793

(22) PCT Filed: Jul. 5, 2006

(86) PCT No.: PCT/IB2006/003399
§ 371 (c)(1),
(2), (4) Date: Jan. 29, 2008

(87) PCT Pub. No.: WO2007/020537
PCT Pub. Date: Feb. 22, 2007

(65) Prior Publication Data
US 2010/0156414 A1    Jun. 24, 2010

(30) Foreign Application Priority Data
Jul. 5, 2005    (WO) .................. PCT/EP2005/007978

(51) Int. Cl.
*G01V 3/00*    (2006.01)
(52) U.S. Cl. ......... 324/321; 324/318; 324/307; 324/309
(58) Field of Classification Search .......... 324/300–322; 600/407–435; 382/128–132
See application file for complete search history.

(56) References Cited

U.S. PATENT DOCUMENTS

| | | | |
|---|---|---|---|
| 3,038,115 A | * | 6/1962 | Mueller ........................ 324/321 |
| 5,424,644 A | | 6/1995 | Zeiger |
| 5,539,315 A | | 7/1996 | Cory et al. |

(Continued)

FOREIGN PATENT DOCUMENTS

EP    0 823 640 A2    2/1998
(Continued)

OTHER PUBLICATIONS

Schnall, M. D. et al., *Wireless Iimplanted Magnetic Resonance Probes for in Vivo NMR*, Journal of Magnetic Resonance 68, 1986, pp. 161-167.

(Continued)

*Primary Examiner* — Melissa Koval
*Assistant Examiner* — Tiffany Fetzner
(74) *Attorney, Agent, or Firm* — Alston & Bird LLP

(57) ABSTRACT

The present invention concerns an apparatus (1') for NMR spectroscopy and/or NMR imaging of a sample. The apparatus comprises a static probe comprising an outer coil for excitation of nuclei of the sample by generating an incident radio frequency field at the Larmor frequency of the nuclei, and for reception of a return radio frequency field emitted by the sample, and a sensitive inner coil (6a') which is mounted closely around or in contact with the sample container and which is wirelessly coupled to the outer coil by an electromagnetic radio frequency field. The sensitive inner coil is embedded in an inner spinning rotor (2) which is rotatively mounted inside the static probe and which is integral with the sample container, so that the filling factor and the radio frequency field amplitude in the sensitive coil are maximized.

35 Claims, 16 Drawing Sheets

U.S. PATENT DOCUMENTS

| | | | |
|---|---|---|---|
| 6,100,687 A * | 8/2000 | Weitekamp et al. | 324/300 |
| 6,317,091 B1 | 11/2001 | Oppelt | |
| 6,670,811 B2 * | 12/2003 | Wind et al. | 324/307 |
| 6,741,079 B2 * | 5/2004 | Hofmann et al. | 324/321 |
| 6,836,115 B2 * | 12/2004 | Wind et al. | 324/307 |
| 7,081,753 B2 * | 7/2006 | Mullen et al. | 324/318 |
| 7,271,592 B1 * | 9/2007 | Gerald et al. | 324/321 |
| 2003/0173967 A1 | 9/2003 | Gerald, II et al. | |
| 2010/0156414 A1 * | 6/2010 | Sakellariou et al. | 324/309 |

FOREIGN PATENT DOCUMENTS

| WO | WO 90/01705 A1 | 2/1990 |
|---|---|---|

OTHER PUBLICATIONS

Yamauchi, K. et al., *Implementing Solenoid Microcoils for Wide-Line Solid-State NMR*, Journal of Magnetic Resonance 167, 2004, pp. 87-96.

Farnan, I. et al., *High-Resolution Solid-State Nuclear Magnetic Resonance Experiments on Highly Radioactive Ceramics*, Review of Scientific Instruments, vol. 75, No. 12, Dec. 2004, pp. 5232-5236.

Sakellariou, D. et al., *Rotating Micro-Coils in Nuclear Magnetic Resonance*, URL:http://66.102.9.104/search?q=cache:IzOr7BpUNnIJ:www.enc-conference.org/LongAbs/E070..., Apr. 6, 2007, 2 pages.

* cited by examiner

Proton Chemical Shift / ppm

APPARATUS FOR HIGH-RESOLUTION NMR SPECTROSCOPY AND/OR IMAGING WITH AN IMPROVED FILLING FACTOR AND RF FIELD AMPLITUDE

CROSS REFERENCE TO RELATED APPLICATIONS

This application is a national stage application filed under 35 USC 371 of International Application No. PCT/IB2006/003399, filed Jul. 5, 2006, which claims priority from PCT/EP2005/007978, filed Jul. 5, 2005.

FIELD AND BACKGROUND OF THE INVENTION

The present invention concerns an apparatus and a method for liquid or solid state Nuclear Magnetic Resonance (NMR) spectroscopy and/or NMR imaging (MRI) of at least one animate or inanimate sample, which allows improving both the filling factor and the radio-frequency field amplitude in at least one detection coil surrounding said at least one sample.

A NMR apparatus contains in a statoric frame magnetic means, radio frequency (RF) means comprising excitation circuits, an emitting coil and RF receiving means. Located in a central hole of this statoric frame, this apparatus contains positioning means for holding the sample or an object to analyse. In some cases, especially in solid state NMR, the means for holding the sample have means for spinning it, and sometimes extra means for tilting the spinning axis. The spinning part is called the rotor. It has a cylindrical shape and wears at one end tiny turbo blades driven by air jets. The rotor is made of a material transparent for magnetic fields, generally made of ceramics. It may be filled with the sample to analyse, but when this sample is small, it wears an internal sample container, mechanically centred and whose axis is parallel to the mechanical axis of the rotor. The invention concerns small sized samples, so the rotor always contains a sample container whose diameter is smaller than the rotor diameter. It is necessary to underline that frequently, in NMR literature, the sample container is abusively called in short "sample" instead of "sample container".

As known for many years, in NMR spectroscopy and/or imaging, the sample—be it an object or a subject—is placed inside a strong static and very homogeneous magnetic field $B_0$. In a quantum description, nuclear spins (assuming that they have a quantum number I=½) can be parallel or antiparallel with respect to the static magnetic field $B_0$. Each of these two states has a different energy in the presence of $B_0$. These energy levels are named Zeeman energy levels, and the spins can absorb energy in the radio-frequency range, to undergo transitions between their two states. In a classical description, the magnetic moments of the nuclear spins precess around the static magnetic field. The frequency $\omega_L$ of the precession (called "Larmor precession") is roughly proportional to the static magnetic field, also depending on the local chemical environment and can be used to probe molecular structure and dynamics. In order to absorb energy and induce transitions, an oscillating magnetic field $B_1$ needs to be applied. This field is produced by antennas (i.e. coils) surrounding the object or subject. This field is oscillating at the Larmor frequency (resonance condition) and can be applied for time delays long enough to perturb the magnetization and rotate it at various angles. The typical NMR experiment consists of the application of this $B_1$ field for a time delay $\tau$, long enough to place the equilibrium magnetization M in the transverse plane xy. The length of this time delay is defined by the relation:

$$\gamma B_1 \tau = \pi/2 \qquad (1)$$

where $\gamma$ is the gyromagnetic ratio of the nucleus.

After application of this radiofrequency field (called $\pi/2$ pulse), the spins return to equilibrium. During this time, the magnetization still precesses around the static magnetic field and its trajectory is detected using antennas (i.e. tuned circuits) at the Larmor frequency.

Usually, the same antenna is used to perturb the nuclear magnetization (i.e. excitation) and then record (i.e. acquire) its response (namely free induction decay, also called "FID") during its return to equilibrium. This signal contains the information about the frequencies of precession and a Fourier analysis of the FID gives the NMR spectrum. On the spectrum one can identify resonances based on their frequency differences.

One also records electronic noise in the signal coming from various sources such as the amplifiers, the preamplifier, the rest of the spectrometer together with thermal noise. Many scans of the signal are collected and summed coherently in order to improve the signal to noise (S/N) ratio on the spectrum.

The reciprocity theorem states that the signal coming from a small volume of sample dV detected by a coil is proportional to the strength of the radio-frequency field $B_1$ that this coil can generate per unit current in the same point of space [1]. Thus, improved sensitivity can be obtained by rendering the strength of $B_1$ field maximum for the volume of interest and this is typically performed by optimizing the filling factor of the coil. This filling factor may be defined as the ratio between the volume of the sample and the volume of the coil, which means that the best sensitivity is obtained for coil sizes comparable to the sample size.

On the other hand, the chemical environment manifests through various interactions, which are anisotropic (i.e. different interactions for different directions in space) and often lead to a continuous distribution of resonant frequencies. In liquids, the anisotropic parts of the interactions are averaged to zero due to free molecular tumbling and translation, thus the NMR spectra are narrow and the chemical information can be easily retrieved. However, in solids, the chemical shift anisotropy, the dipolar interactions, the quadrupolar interaction and sometimes the scalar couplings and the magnetic susceptibility broaden the spectrum and account for the loss in spectral resolution. One routinely used solution to improve resolution is the fast spinning of the sample around an axis making an angle, named magic angle, of approximately 54 degrees with the static magnetic field [2]. This technique, which is called "Magic Angle Sample Spinning" (MAS) is one of the cornerstones of high-resolution solid-state NMR, and most solid-state NMR probes are currently able to spin small sample holders (i.e. rotors) from 1000 Hz to 35000 Hz or even more. There have been methods of higher order averaging using simultaneous rotation, such as the method called "Double Rotation" (DOR, see [3]) or the sequential rotation method called "Double Angle Spinning" (DAS, see [4]) of the sample around two axis.

In all cases, RF antennas are fixed to the body of the probe or the stator, thus static, and placed outside of the sample holder leading to a poor filling factor and reduced sensitivity, especially for DOR experiments.

In liquid state NMR, liquid samples are studied using ordinary macroscopic size saddle type coils (i.e. macro-coils having a diameter ranging from 1 mm to 10 mm) or more recently micro solenoidal type coils have been designed to closely fit to horizontally disposed capillary tubes (100-1000 μm diameter), as shown in the drawings of [5-7] references. A drawback of these apparatuses is that they can only work with the coils being electrically connected and mechanically linked to the static part of the probe: this means that specific probes need to be constructed in each case.

In solid state NMR, static solid samples may be studied but most of the studies are performed under "Magic Angle sample Spinning" (MAS). Spinning allows for an averaging of the anisotropic interactions and thus for an improved spectral resolution. Very recently, micro-coils have been used in studies of static solid samples, improving upon sensitivity and $B_1$ field strength [8]. In all modern setups, an antenna is used for excitation and detection, and it is static, being typically fixed on the body of the probe head with respect to the rotating sample.

Moreover, rotating small (sub-millimeter) objects very fast—typically at thousands of Hz—appears to be very difficult, because of mechanical constraints and demanding micro-machining. The sample holder needs to withstand high gas pressures and mechanical stress, and thus to have a non-negligible wall thickness. Common rotors have wall thicknesses ranging from about 0.5 mm to 0.75 mm, and scaling down to smaller sizes would compromise their mechanical stability. Machining hard materials with precision gets also very demanding for sub-millimeter sizes. Thus, it is very difficult to develop micro-rotors that rotate fast inside static RF micro-coils.

Various types of RF antennas have been used in the past in NMR and MRI. They generally comprise an electronic part consisting of the tuning and matching elements necessary to produce a tuned circuit and a coil close to, or inside which, the animate or inanimate sample under study is placed. This circuit can be tuned at the same time to many frequencies, allowing for multinuclear studies.

Inductive coupling between two circuits can be performed through physical proximity between them. The mutual inductance M between two coils is equal to the flux that crosses one coil when a current unity flows into the other one: it depends upon the geometrical characteristics of the coils and upon the distance between them. The coupling coefficient is defined as $k=M/\sqrt{(L_1 L_2)}$ where $L_1$ and $L_2$ are the inductances of the two coils. For a tuned secondary coil coupled to a primary coil, half of the total power dissipation occurs in the secondary when $k=k_c=1/\sqrt{(Q_1 Q_2)}$, where $Q_1$ and $Q_2$ are the quality factors of the two coils.

In imaging such as in MRI, inductive coupling between two or more coils is commonly used in order to acquire images [9, 10], with the purpose to optimize the detection and the tuning bandwidth of the coil over a region of interest [11]. A secondary coil can be implanted [12] into the subject and allows for continuous monitoring. The sample under study, typically a patient, is static and motion can induce variations in the coupling between the primary and the secondary circuits, leading to signal and $B_1$ amplitude variations. It is worth mentioning that in medical MRI the nature of the interactions is such that no spatial averaging is required by rotating the sample. The interactions are isotropic for MRI and thus no MAS technique is applied, leading to a completely different and independent development of the techniques than for NMR spectroscopy.

In NMR spectroscopy, however, inductive coupling has had much less success and it is essential to note here that it has only been used as a convenient way to match the impedance of the probe to the one of the generator. It has never been used in order to improve upon the filling factor in high-resolution NMR spectroscopy (high-resolution NMR meaning by usual definition a very specific NMR technique in which the strong magnetic field allows to detect small frequency shifts, such as a few Hz).

In spectroscopy, as explained above, one uses a detection coil that surrounds the sample under study in a way to provide a maximum filling factor and thus to optimize the sensitivity of detection for samples of standardized size. In solid state and liquid state NMR spectroscopy, the sample containers have standardized size that cannot suit to any sample, especially very small sized samples. Hence, using commercially available probes to study very small sized samples corresponds to a poor filling factor, resulting in a poor signal sensitivity.

In the particular case of samples of shielded radioactive materials, recent investigations are related by [13]: triple barrier containing rotors (of 7.5 mm outer diameter) were spun (at 3.5 kHz) and used to record 29Si spectra under MAS in ceramics containing 238Pu and 239Pu. One of the barrier was the rotor container itself, a second barrier of "Teflon" was used and a final barrier of "Shapal" was used to contain the radioactive material. However, as it is widely known, the existence of many protective layers reduces the sensitivity of detection. In common signal to noise formulas, the filling factor of the coil plays a very important role, since better sensitivity is achieved when the size of the coil is adapted to the size of the sample. If shielding barriers are needed, then the volume of the sample is reduced while the volume of a static coil remains the same, which drastically lessens the sensitivity.

SUMMARY OF THE INVENTION

One purpose of the present invention is to overcome the above-exposed drawbacks and, in particular, those relating to the filling factor and the sensitivity of the NMR probe especially for small solid fast spinning samples. This is achieved by the apparatus for liquid or solid state NMR spectroscopy and/or NMR imaging of at least one animate or inanimate sample according to the invention, which comprises:
 at least one sample container comprising a sampling volume which is designed to be filled by said at least one sample and to be subjected to an electromagnetic radio frequency field, and
 a static probe comprising an energizing circuit for excitation of nuclei of said at least one sample by generating an incident radio frequency field at the Larmor frequency of said nuclei, and for reception of a return radio frequency field emitted by said at least one sample,
 wherein said apparatus comprises at least one sensitive coil which is mounted closely around or in contact with said sample container and which is coupled to said static probe by an electromagnetic radio frequency field, and wherein said sensitive coil defines a sensing volume which is substantially equal to said sampling volume.

The apparatus of the invention is characterized in that said sensitive coil is embedded in an inner spinning rotor which is rotatively mounted inside said static probe and which is integral with said sample container, so that both the filling factor and the radio frequency field amplitude in said sensitive coil are maximized.

According to a general practice in NMR techniques, in the present description the frequency corresponding to pulsation ω is shortly called "frequency ω" instead of the proper designation "frequency ω/2π".

By "electromagnetic radio frequency field", it is meant a coupling without any electrical contacts (i.e. a coupling which is devoid of any galvanic contacts), be it either a radio frequency electric field (transmitted through a capacitor) or a radio frequency magnetic field (transmitted through inductively coupled coils).

By "sensing volume" of said sensitive coil, it is meant in the present description the inner space of this sensitive coil, which is submitted to said electromagnetic field.

By "spinning rotor", it is meant by definition a rotor which is able to continuously rotate according to more than 360 degrees, for instance at a spinning frequency of at least a few Hz.

By "integral with", it is meant in the present description an assembly where both related parts may not move relative to one another (i.e. no relative motion between the rotor, the sensitive coil and the sample container).

One should note that said sensitive coil is preferably mounted in contact with by any lithography process (e.g. etching process), micromachining process (e.g. laser micromachining), any microfabrication process (e.g. laser polymerization and metallization) or any wire winding technology, said sample container, although it may be also mounted a few millimeters or a fraction of millimeter around the latter, preferably at a distance less than or equal to 2 mm, in order to obtain a satisfactory filling factor.

In a preferred first embodiment of the invention, said electromagnetic radio frequency field is performed through a radio frequency magnetic field.

According to this preferred embodiment, said apparatus also comprises at least one resonant circuit for detection of precession frequencies of said nuclei, which is electromagnetically coupled to said static probe so as to be tunable thereto substantially at the Larmor frequency of said nuclei, and which comprises said sensitive coil mounted within the emitting coil of said energizing circuit.

So said apparatus comprises a static probe which is, according to this preferred embodiment, electromagnetically coupled to said at least one resonant circuit which is tuned substantially at the Larmor frequency of said nuclei.

The filling factor and radio frequency field amplitude in said sensitive coil being both maximized, this apparatus according to the invention is particularly—but not only—suitable for high-resolution NMR spectroscopy of small solid samples, and also for NMR imaging thereof.

Further, it should be noted that said apparatus according to the invention may also be used to study small static liquid-state samples, in combination with an existing commercially available NMR probe. The increase in RF field amplitude will be particularly useful in the case of very broad spectra, typical of paramagnetic proteins.

In the preferred first embodiment of the invention, the electromagnetic radio frequency field is a magnetic field, applied through magnetic induction between the probe emitting coil and the sensitive coil therein, this sensitive coil being mounted on or closely around said at least one sample container. To increase inductive energy transfer, it is necessary to constitute a quasi resonant circuit connecting a capacitor to the sensitive coil. The theory of coupling between tuned circuits has been described in length in the literature [14]. In such a magnetic coupling, the sensitive coil acts both as a magnetic field concentrator for the excitation field, and as a signal enhancer for the response signal thanks to the reciprocity theorem.

To form such a resonant circuit, the coil must be connected to a net that further comprises at least one capacitor, and eventually a set of capacitors and/or inductors which is connected to the terminals of said sensitive coil.

The sensitive micro-coils (inductors) according to the invention can be manufactured according to standard techniques, and they may surround either the sample containers, such as small capillaries [15-20]. These sensitive micro-coils may either be of a solenoidal coil type (generally used for solid state NMR), of a saddle coil type (generally used for liquid state NMR) or of any other design existing in the NMR/MRI literature, like surface coils, conical coils, Litz coils, etc. But they may also be formed by a conducting coating directly deposited on the sample container itself. As far as the sensitive micro-coil is spinning, saddle type embodiment is not preferred.

Advantageously, the coil type (solenoidal or saddle type) of the sensitive coil is chosen of the same type than the emitting coil. That is to say, with a solenoidal emitting probe, the sensitive coil is advantageously solenoidal, and in the case of a saddle type emitting probe, the sensitive coil would be advantageously of a saddle type, which implies that the sensitive coil would not spin.

More preferably, the shapes of said at least one emitting coil and said at least one sensitive coil both have a cylindrical symmetry, and then they each define a revolution surface. The size of the conductor used for the fabrication of the micro-coil must carefully be chosen in order to minimize Eddy current effects and heating effects. Wire diameters varying from 5 to 150 micrometers are advantageously used and the number of turns is optimized to keep thermal effects as low as possible. The windings may be irregular, either to improve field homogeneity or to reach a specific magnetic field pattern.

One should note that such an apparatus according to the invention allows to optimize the filling factor and thus the sensitivity of detection for samples requiring special handling, and also to render the radio frequency field amplitude in the sensitive coil as large as possible, irrespective in a large range of the values of the coupling constant k between both energizing and resonant circuits. However, the power transfer between probe coil and sensitive coil will decrease significantly if the volume of the sensitive coil becomes smaller than a volume $V_2$ as defined below.

The optimal efficiency for the apparatus of the invention is obtained, provided the following additional conditions be satisfied.

For a quality factor $Q_1$ of the NMR static probe, and an expected quality factor $Q_2$ of the resonant circuit according to the invention, let us define by $V_1$ the volume in which the radio frequency field is generated by the NMR static probe and by $V_2$ said sensing volume (which is determined by the sensitive coil mounted closely around said sample), $V_2$ being as close as possible of the effective volume of the sample (i.e. said sampling volume). Then, the optimal performances will be reached if:

$$V_2 > V_1/(Q_1 \cdot Q_2)$$

Of course, each dimension determined by $V_2$ (i.e. diameter or length) must also be smaller than the equivalent dimension of the emitting coil of the NMR static probe in which it is settled.

In an exemplary embodiment of the invention, said static or rotating sensitive coil is a micro-coil having a diameter preferably between 100 µm and 1500 µm.

According to said first embodiment of the invention, said resonant circuit is inductively coupled to said energizing circuit.

According to this first embodiment, said resonant circuit may further comprise at least one capacitor which is connected to the terminals of said at least one sensitive coil and which may comprise a thin cylindrical film surrounding said sensitive coil.

In this case, said capacitor may either have:

two concentric cylindrical plates which extend parallel to the axis of said sensitive coil, so as to define respective inner and outer axial faces of said cylindrical film, or two parallel annular plane plates which extend perpendicularly to the axis of said sensitive coil, so as to define respective end radial bases of said cylindrical film.

According to a variant of this first embodiment of the invention, said resonant circuit may consist of said sensitive coil (i.e. being then devoid of any capacitor), which is made in this case of one or several self-resonant micro-coil(s), advantageously for spectroscopy of high gamma nuclei, such as tritium, hydrogen of fluorine.

In such a variant, said sensitive coil may be made either of one self-resonant solenoidal micro-coil, or of a self-resonant plurality of concentric metal rings (R) which are axially spaced around said capillary (3) along the axis thereof.

According to still another variant of this first embodiment of the invention, said resonant circuit may comprise a plurality of sensitive coils arranged to define at least one tank circuit, so that said resonant circuit is tunable to said static probe at multiple Larmor frequencies for the analysis of multiple types of nuclei at the same time.

In this other variant, said resonant circuit may advantageously be a double frequency-tunable one comprising two sensitive coils, one of which is series connected to said tank circuit including the other one.

Such double and multiple resonance systems allow to study multiple types of nuclei at the same time (either in liquid and solid state NMR or MRI), particularly on the low frequency channel (dedicated for the low frequency nucleus, typically carbon-13, nitrogen-15, silicon-29, etc.), while applying a radio-frequency irradiation on the high frequency channel (typically hydrogen, fluorine, tritium).

In a second embodiment of the invention, the electromagnetic radio frequency field is a radio frequency electrical field. In this case, this electrical field coupling is advantageously performed through capacitors, two input and output capacitors being series connected with said sensitive coil, so that said radio frequency electrical field passes through said capacitors.

According to a preferred feature suitable for rotating probes, each of said input and output capacitors is made of a static cylindrical plate which is mechanically linked to said static probe and of a rotating cylindrical plate which is mechanically linked to said sensitive coil and embedded in said sample container, those two cylindrical plates facing each other and having the same symmetry axis than that of the rotor and that of said sample container.

To limit electrical interactions between those two capacitors, said input and output capacitors are advantageously both embedded at each end of the rotor, close to the respective ends thereof.

In such an embodiment, the self inductance L of the coil and the value of the two coupling capacitors C are chosen to maximize the power transmitted by the probe to the radio frequency field applied to the sample. Advantageously, they are comprised in an adapting network, consisting of a set of capacitors and/or inductors, which is connected to the terminals of said sensitive coil.

According to this second embodiment of the invention, the two plates of each input and output capacitor may either be:

concentric, in such a manner that each static plate surrounds said rotor incorporating each rotating plate, or parallel and axially spaced along said symmetry axis, in such a manner that each static plate is located axially outside said rotor incorporating each rotating plate (It is to be noted that this variant is particularly advantageous, in that the values of the capacitance can be higher and thus a larger range of nuclei can be studied).

Whatever the type of electromagnetic coupling, according to another feature of the present invention, said at least one sensitive coil may advantageously be rotatively mounted inside said static probe, being embedded in said inner rotor which is integral with said sample container and said sensitive coil.

It is thus to be noted that such an apparatus of the invention allows for the use of either static or rotating sensitive coils, depending upon the samples to be analyzed.

According to a preferable feature of the present invention, said at least one sample container is a capillary on the surface of which said at least one sensitive coil is mounted.

One should note that the use of such small sensitive coils—preferably micro-coils—allows for a localized detection of samples, and background signals coming from the housing of the probe or from the stator are greatly attenuated.

It was also noticed that said at least one static or rotating sensitive micro-coil has a length preferably of between 1 mm and 20 mm and a number of turns preferably ranging from 1 to 20, which combination has experimentally proved to provide a maximization of the radio frequency field amplitude in said sensitive coil.

There are many cases where using rotating micro-coils provides a unique means to perform a NMR analysis (for instance a high-resolution NMR analysis).

The first case is where the sample quantity is limited (a few micrograms), and placing it inside commercially available NMR rotors would not be advantageous because of the small filling factor. One could design smaller rotors in order to enhance the filling factor (in practice the smallest rotors are 2 mm outer diameter [21]), but the challenge becomes insurmountable when sub-millimeter scale rotors need to be machined. In particular the wall thickness together with the required strength for the material renders this task extremely difficult. Using rotating micro-coils according to the invention allows achieving higher filling factors, without the restrictions linked to the small size sample spinning.

The invention is well suited for any sample that requires a shielding, provided that shielding allows the transfer of magnetic fields, and in the case of an electric field coupling, provided that shielding also allows the transfer of electric fields.

For instance, it may be used for radioactive samples shielded by protective layers transparent to magnetic fields such as lead oxides. The sensitive coil is advantageously placed inside the shielding, next to the sample.

Another type of shielding allowed by the invention is of biological type, when a "sensitive" product must be protected from contamination, or the environment must be protected from the contamination by this product. In this case also the sensitive coil is advantageously placed inside the shielding, next to the sample. So, the benefits of the invention are not significantly affected by the presence of one or several shieldings. As far as the sample container remains unchanged, and the shieldings do not alter the magnetic field, the sensitivity is the same with or without shieldings.

In the case of a sample whose contamination is prohibited (radioactive or biologically harmful material), according to an aspect of the present invention, said inner rotor of the NMR apparatus—which is integral with both said at least one sample container and said resonant circuit, as above indicated—may include a plurality of shieldings barrier layers which are provided around said at least one sample container and which form the outer wall of this inner rotor. If the sample is a radioactive material, said shieldings are radioactive barrier layers.

Thus, the sample holders (i.e. rotors) may be designed to have protective barriers against sample or probe damage, since the sensitivity of the experiment depends less crucially on the size of the rotor. This may have a particular importance in the study of size-limited samples, sensible, hazardous or even fragile samples, such as biological substances, radioactive materials, or studies under very high pressure and/or temperature.

According a particular embodiment of the present invention, said apparatus may further comprise an outer rotor which surrounds said inner rotor and which is adapted to rotate at a slower frequency than that of the latter, so as to allow a simultaneous double rotation according to the "DOR" NMR probe design.

According to a specific embodiment of the invention, said apparatus may have several detection coils (i.e. sensitive coils), each one tuned on a different Larmor frequency corresponding to a different nucleus, in such a way that only one micro-coil can be excited by the RF field of an excitation coil. This means that the various frequencies of the various micro-coils are different enough, to prevent the excitation of several micro-coils at the same time. The emitting coil of the probe is thus sequentially excited close to any of the resonant frequencies of the different detection coils, each one surrounding one sample. Those samples may be either in different sample containers placed with their axis parallel to the mechanical axis of the rotor, and parallel one to the other and at a distance great enough to prevent the interference from one sample to the other, or at different distances along the same sample container, those distances being large enough to prevent the interference from one sample to the other.

A method according to the present invention for solid or liquid state NMR spectroscopy and/or NMR imaging of at least one animate or inanimate sample which uses an apparatus comprising at least one sensitive coil which is mounted closely around said sample and defines a sensing volume being substantially filled by said sample, said method comprising:

subjecting to an electromagnetic radio frequency field said sample which fills a sample container, and excitating nuclei of said sample by an electromagnetic radio frequency field by generating a incident radio frequency field at the Larmor frequency of said nuclei, and receiving a return radio frequency field emitted by said sample, this excitation and reception being accomplished by an energizing circuit of a static probe of said apparatus, said at least one sensitive coil being coupled to said static probe by an electromagnetic radio frequency field, is characterized in that it also comprises spinning an inner rotor in which said at least one sensitive coil is embedded and which thus spins inside said static probe and which is integral with said sample container, so that both the filling factor and the radio frequency field amplitude in said sensitive coil are maximized.

According to the preferred embodiment of this method according to the invention, said electromagnetic radio frequency field is a radio frequency magnetic field.

In this case, this RF field induces an electromagnetic coupling to said energizing circuit of at least one resonant circuit comprising said at least one sensitive coil within an emitting coil of said energizing circuit, said at least one resonant circuit detecting the precession frequencies of said nuclei and being tuned to said energizing circuit substantially at the Larmor frequency of said nuclei.

According to an alternative embodiment of this method according to the invention, said electromagnetic radio frequency field is a radio frequency electrical field, as explained above for said apparatus.

Advantageously, said at least one sample is a solid one, and may be used either in a static or a rotating way at any spinning frequency, while implementing said method.

According to this method of the invention, said at least one sensitive coil may spin in a continuous way at a spinning frequency of at least 1 Hz.

This method of the invention may advantageously be used in either liquid or solid state NMR, and said resonant circuit may be designed according to the expected spectral resolution.

In a specific embodiment of the invention, said at least one resonant circuit is advantageously rotated inside said static probe at a spinning frequency greater than 1 kHz and, more advantageously, at a spinning frequency ranging from 3 kHz to 35 kHz.

According to another aspect of the invention, said method comprises rotating said resonant circuit by means of an inner rotor which is integral with both said at least one sample container and said resonant circuit, using a technique selected from the group consisting of the Magic Angle Sample Spinning technique ("MAS"), the Double Rotation technique ("DOR") and the Double Angle Spinning technique ("DAS").

It is to be noted that commercially available "MAS" probes may be used to provide a tunable energizing circuit, which can ensure a fine tuning for the assembly.

The invention may use several detection coils (i.e. sensitive coils), tuned on different frequencies, different enough not to interfere with one another. In this case, the emitting coil of the probe is sequentially excited close to any of the resonant frequencies of the different detection coils, each one surrounding one sample.

The invention is particularly advantageous for any nuclei whose excitation and manipulation require a large amplitude radio frequency field (e.g. protons and even more oxygen-17). Experiments on static liquid samples (e.g. paramagnetic proteins), where the large $B_1$ field offers the possibility to excite quantitatively over a wide range of frequencies, may further be carried out.

BRIEF DESCRIPTION OF THE DRAWINGS

The above-mentioned characteristics of the present invention, along with others, will be understood more clearly on reading the following description of several examples of the invention, which are given for illustrative purposes and are not intended to limit the invention, said description referring to the attached drawings, wherein.

DETAILED DESCRIPTION

Figure 1A:
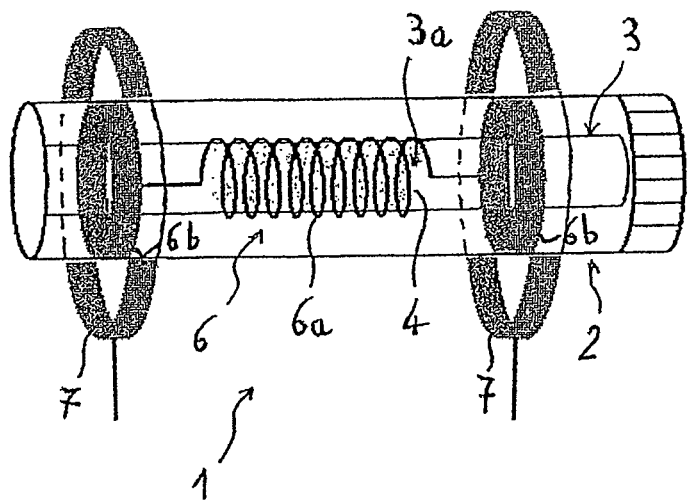
FIG. 1a is a partial and schematic longitudinal sectional view of a NMR apparatus according to the invention, with coupling by an electric field.

The high-resolution NMR apparatuses 1 and 1' respectively shown in FIGS. 1a, 2a and 1b, 2b each essentially comprise a rotor 2 in which is embedded a capillary 3 comprising a sampling volume 3a which is designed to be filled by a sample 4 (the rotor 2 thus forming a spinning sample holder) and to be subjected to an electromagnetic RF field during the rotation of the sample 4, by means of:

a static probe comprising a usual antenna-containing energizing circuit for excitation of nuclei of the sample 4 (the static probe and its energizing circuit are not shown in their entirety), the energizing circuit (not shown on these drawings) surrounding the rotor 2 and being designed to generate the RF field, and a resonant circuit 6' or a circuit 6 which is matched with surrounding circuits to exhibit a resonance, for detection of the precession frequencies of the nuclei, this circuit 6, 6' being electromagnetically coupled (i.e. by a wireless connection) to the energizing circuit so as to be tunable thereto substantially at the Larmor frequency of the nuclei, and comprising a small sensitive micro-coil 6a or 6a' mounted around the capillary 3 and within the static probe.

Figure 1B:
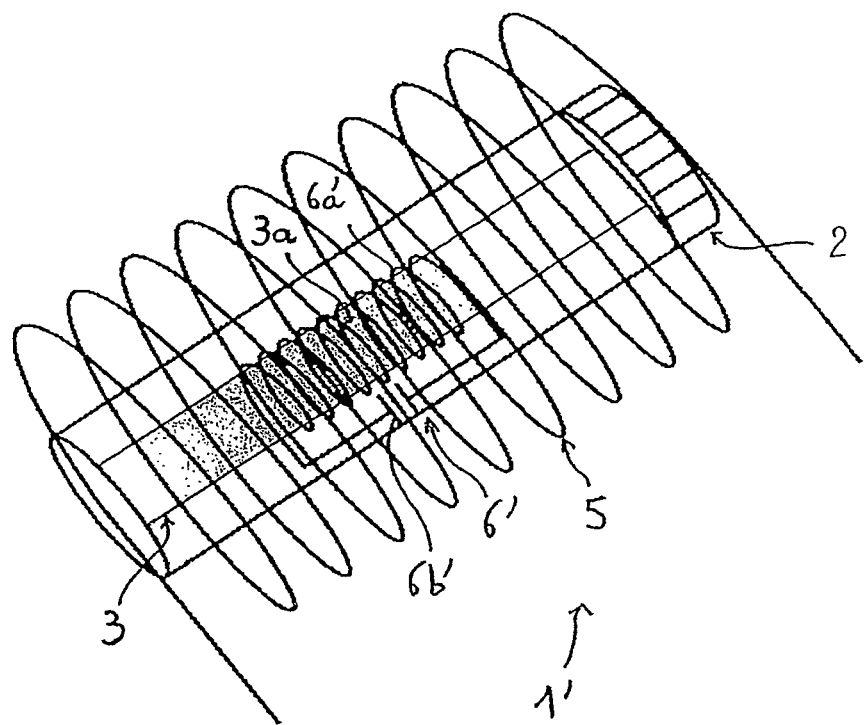
FIG. 1b is a partial and schematic longitudinal sectional view of another NMR apparatus according to the invention, with coupling by a magnetic field.

As may be seen in FIGS. 1a and 1b, the sensitive micro-coil 6a or 6a' defines an inner sensing volume which is substantially equal to the sampling volume 3a of the capillary 3.

Figure 2A:
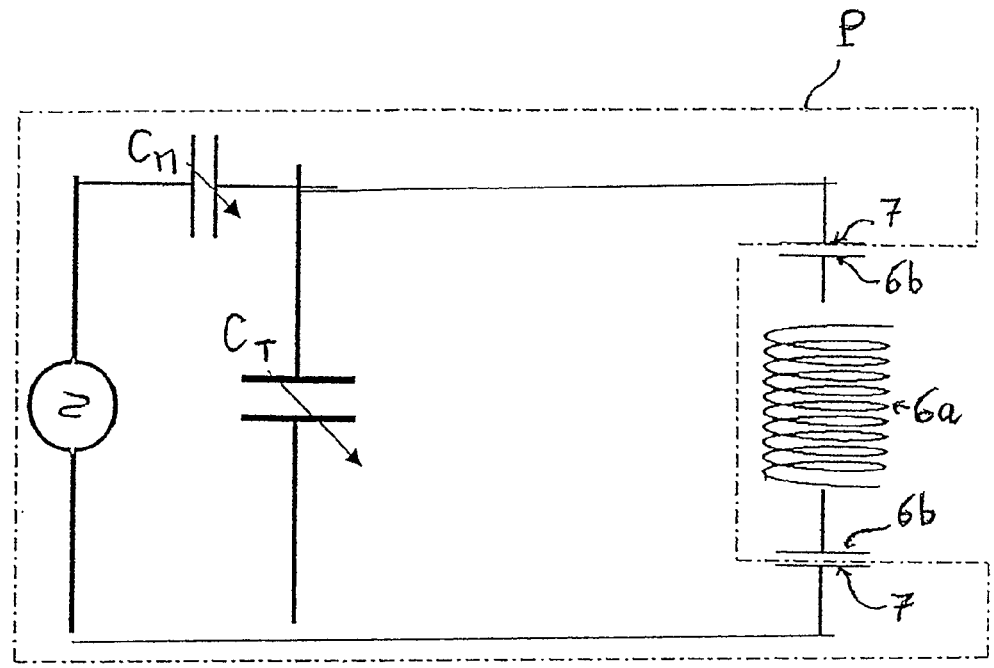
FIG. 2a is a schematic view of the electronic components of the apparatus according to FIG. 1a, showing an electric field coupling.

More precisely, the apparatus 1 of FIGS. 1a and 2a shows a capacitive (i.e. electric) coupling between the sensitive micro-coil 6a, which is mounted around the capillary 3 and forms a detection/excitation coil, and the rest of the apparatus 1 including a static probe P, shown in FIG. 2a, which comprises the energizing circuit. The micro-coil 6a is physically connected at each end to a metal ring 6b (preferably made of copper) covering the rotor lateral surface between two parallel circles. The capacitive coupling occurs between these rings 6b and two statoric cylindrical surfaces facing them, forming external concentric metal rings 7 (preferably also made of copper) that are fixed in the housing (not shown) of the probe P. The width of the air gaps between the rings 6b and 7 determines the values of the capacitance of the resonant circuit 6, such rings 6b and 7 respectively forming the capacitor plates of two capacitors. This arrangement allows the electrical connection during the free rotation of the sample 4. The distance between these metal rings 6b and 7 has thus to remain constant during the spinning of the rotor 2.

Figure 2B:
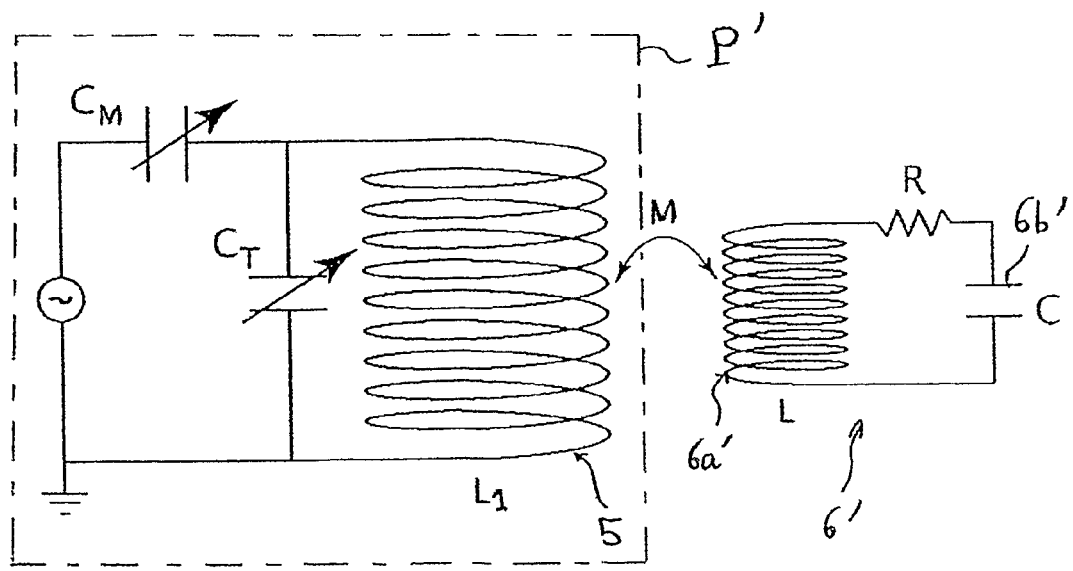
FIG. 2b is a schematic view of the electronic components of the apparatus according to FIG. 1b, showing a magnetic field (inductive) coupling.

The apparatus 1' of FIGS. 1b and 2b shows an inductive (i.e. magnetic) coupling between the two tuned circuits, i.e. the resonant one 6' and the energizing one. The sensitive micro-coil 6a' surrounds the capillary 3 and is tuned to the resonance frequency using a small capacitor 6b', schematically drawn aside the coil, but which is generally settled on the rotation axis. As shown in FIG. 2b, the energizing circuit of the static probe P' contains an emitting macro-coil 5, which surrounds the rotor 2 and which is fixed to the housing of the probe.

Figure 1C:
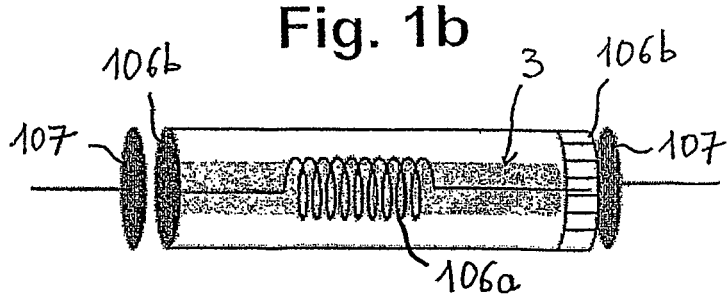
FIG. 1c is a partial and schematic longitudinal sectional view of a variant according to the invention of the NMR apparatus of FIG. 1a, with coupling by an electric field.

As shown in FIG. 1c, which is a variant of FIG. 1a, another embodiment for capacitive coupling between the static probe P and a possibly rotating micro-coil 106a is such that the rotating plates 106b and the static plates 107 replacing the afore-mentioned rotating plates 6b and static plates 7 are kept at a fixed distance during sample spinning, being axially spaced along the symmetry axis of the capillary 3. This wireless coupling between the static part P and the potentially rotating part containing the micro-coil 106a is thus also performed by means of two air capacitors. In this design, the rotor's upper and bottom parts are electroplated and tethered to the micro-coil 106a. The static part P has also these two metallic plates 107 positioned at the right distance from the rotor's plates 106b (this distance is kept constant during the static of spinning experiment).

Figure 1D:
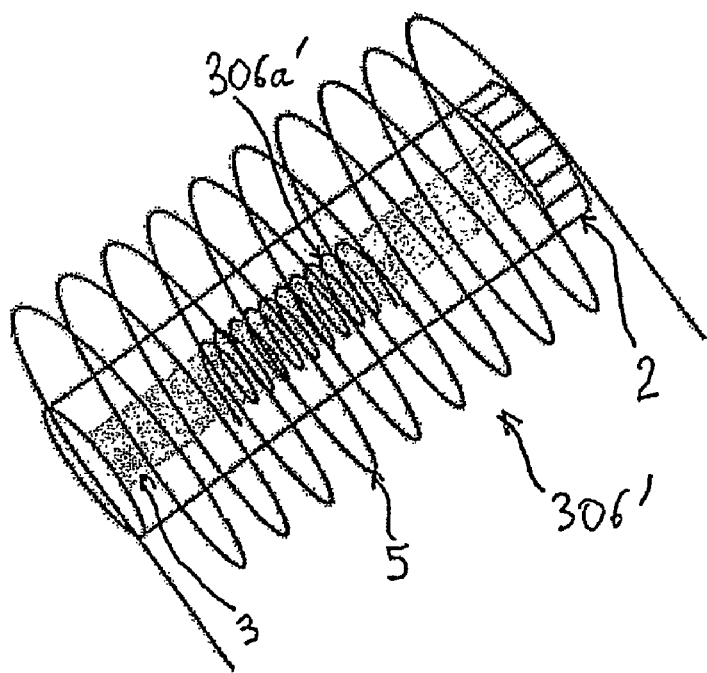
FIGS. 1d and 1e are respective schematic variants according to the invention of the NMR apparatus of FIG. 1b, both with coupling by a magnetic field to a self-resonant sensitive micro-coil, FIGS. 1f and 1g schematically show a specific embodiment of the invention with a plurality of micro-coils, FIG. 1f with magnetic coupling and FIG. 1g with capacitive coupling.
Figure 1E:
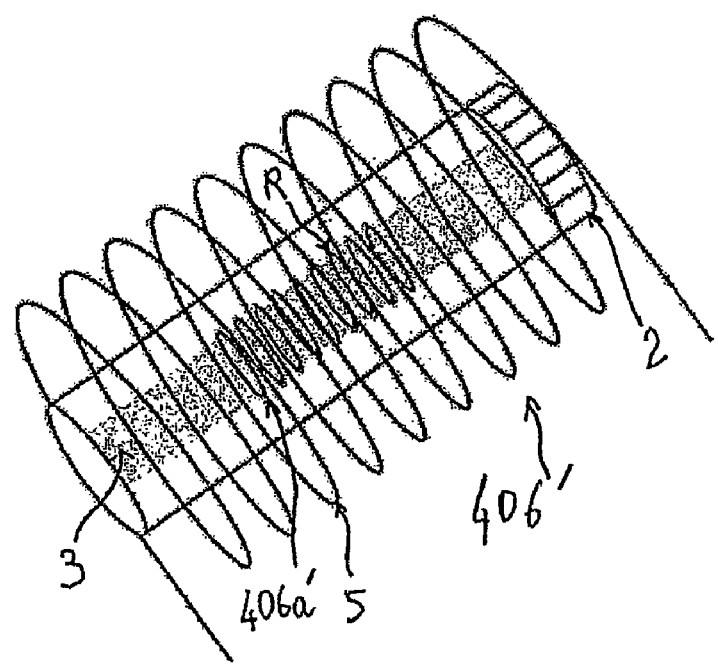
Figure 1F:
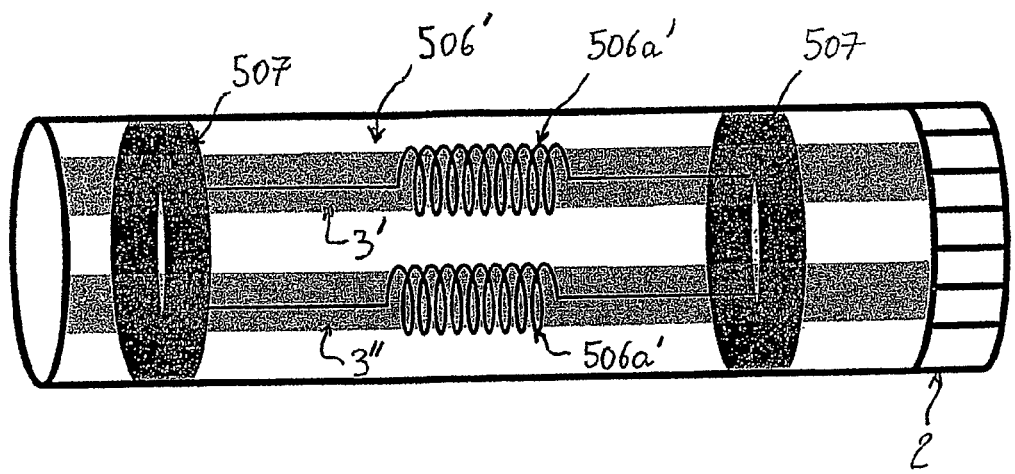
Figure 1G:
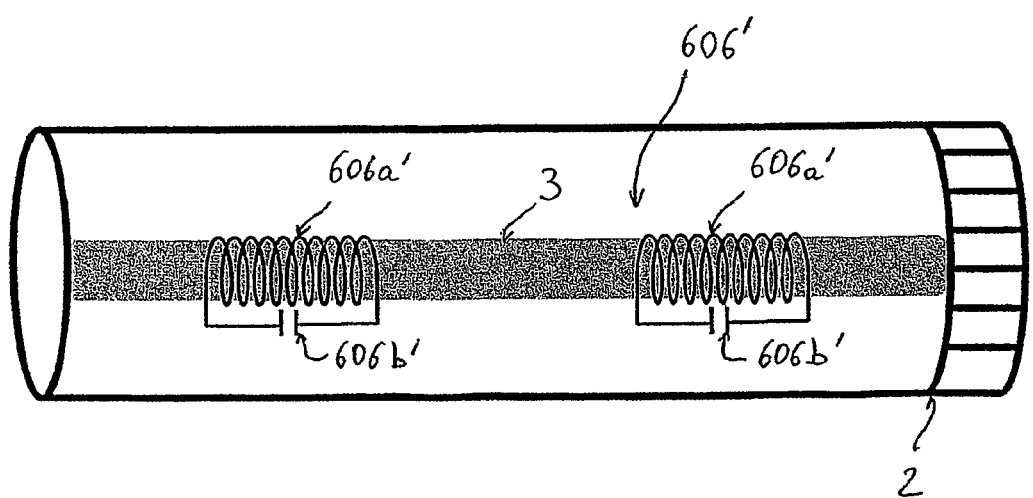

As shown in FIGS. 1d and 1e, which are both variants of FIG. 1b for inductive coupling between the primary and a sensitive micro-coil 306a' or 406a', the corresponding resonant circuit 306' or 406' exclusively consists of a solenoidal self-resonant micro-coil 306a' in FIG. 1d or a self-resonant micro-coil 406a' made of concentric metal rings R which are axially spaced around the capillary 3 axis in FIG. 1g. Both types of micro-coils are specially advantageous for spectroscopy of high gamma nuclei, such as tritium, hydrogen of fluorine.

More precisely, FIG. 1d shows a solenoidal shape self-resonant micro-coil 306a' which is wrapped around the sample containing capillary 3. The winding of the self-resonant micro-coil is not equidistant in order to maximize the radio-frequency field homogeneity at the volume of the sample. The capillary 3 is centred inside the rotor 2 and spun with it. FIG. 1e shows the concentric rings R which form a resonator close to the Larmor frequency of the spins. The homogeneity of the radio-frequency field can be optimized by the changing the gap between the rings R.

It is to be noted that both self-resonant micro-coils 306a' and 406a' of FIGS. 1d and 1e allow to improve the spinning stability of the assembly in the rotor 2.

Thanks to their dimensions, several micro-coils 506a' or 606a' can be included in the same rotor, either along the same sample container 3 or around one or several sample containers 3' and 3" as schematised in FIGS. 1f and 1g, FIG. 1f with magnetic coupling and FIG. 1g with capacitive coupling (each micro-coil 606a' being combined with a capacitor 606b'). Preferentially, a micro-coil 506a', 606a' is around a single sample container 3 or 3', 3" to maximize the filling factor; but putting a micro-coil around several sample containers is still in the scope of this invention.

Figure 2C:
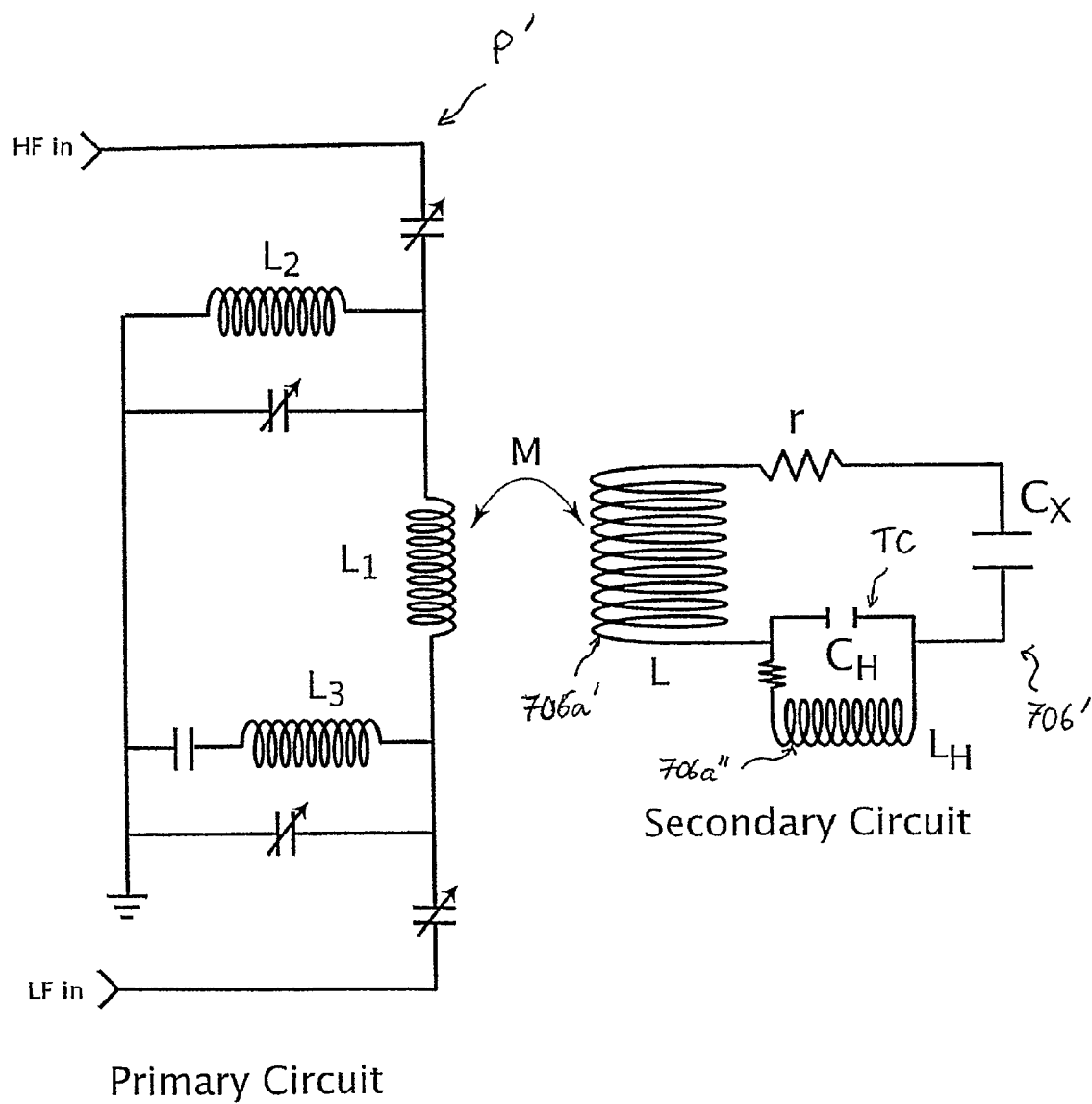
FIG. 2c is a variant according to the invention of the apparatus of FIG. 2b showing a multiple-tuned inductive coupling.

FIG. 2c is a variant of FIG. 2b, wherein the resonant circuit 706' is a double frequency-tunable one which comprises two sensitive coils 706a' and 706a" arranged to define at least one tank circuit TC, so that this resonant circuit 706' is tunable to the double resonance static probe P' at two Larmor frequencies for the analysis of two types of nuclei at the same time. Thus, FIG. 2c shows how to doubly tune a micro-coil 706a' which is inductively coupled to a double resonance NMR probe.

As apparent from FIGS. 2a and 2b, 2c, it is to be noted that the coupling by electric field of FIG. 2a essentially differs from the coupling by magnetic field of FIG. 2b or 2c, in that the corresponding static probe P includes the capacitor plates 7 in place of the emitting macro-coil 5 of the static probe P' of FIG. 2b or 2c.

The angle between the axis of the coils 5, 6a or 6a' and the static magnetic field is preferably set to be equal to the magic angle, according to FIGS. 1a and 1b, but it can generally be arbitrary.

Now, this inductive coupling will be discussed with reference to FIG. 2b.

Generally, the energizing circuit corresponds to the circuit of a commercial NMR probe, while the resonant circuit 6' includes a coil 6a'—preferably a micro-coil—placed inside the emitting coil 5. The coupling M between both circuits depends on the geometric characteristics of the coils.

Let the inductance of the sensitive coil 6a' of FIG. 1b be L. At the terminals of the coil 6a', a small capacitor 6b' of capacitance C (of either fixed or variable type) is connected, for instance by soldering or through a micro connector that, together with the inductor, makes the tuned LC resonant circuit 6' tuned at the Larmor frequency of the observed nuclei. The quality factor Q of the circuit 6' depends on the resistance R of the coil 6a' and of the quality factor of the capacitor 6b'. It can be related to the inductance L and to the resistance R by the formula: $Q=L\omega/R$. The value of the capacitance C is chosen in the vicinity of the theoretical value $C_L$ from the formula:

$$C_L = 1/L\omega_L^2 \qquad (2),$$

in order to tune this resonant circuit 6' on resonance.

Figure 6:
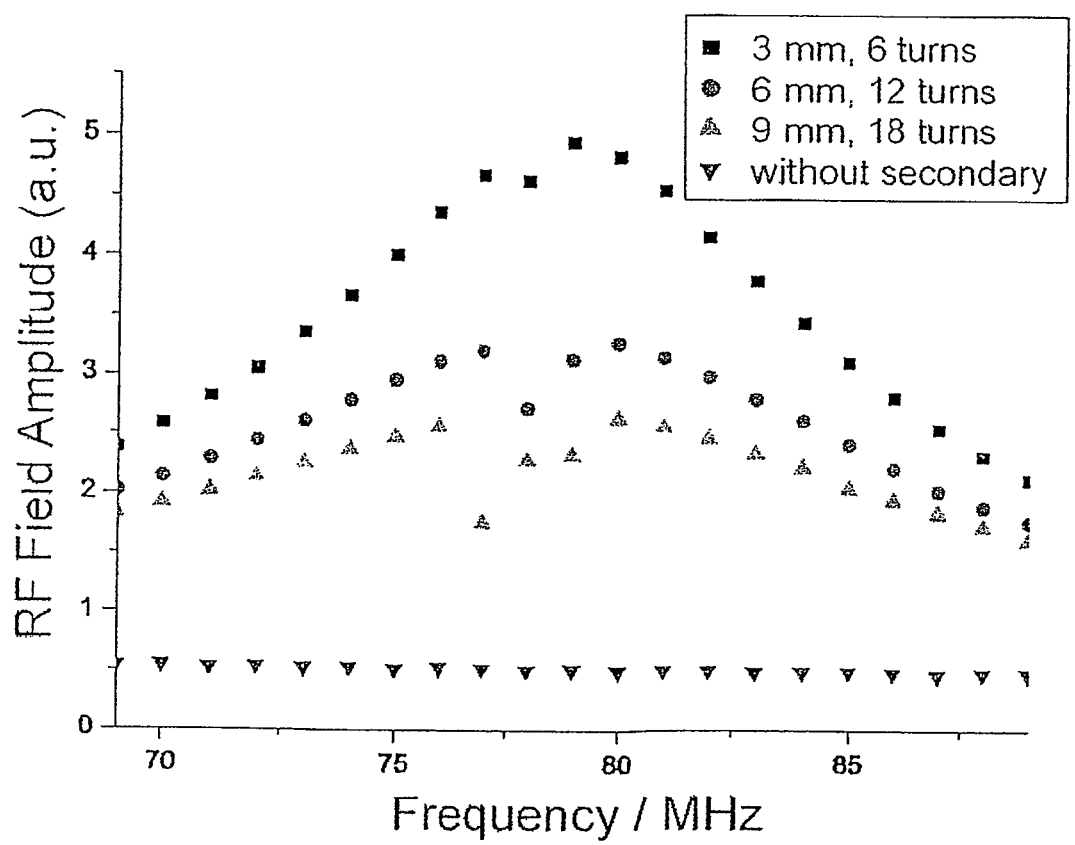
FIG. 6 is a multiple plot graph showing the evolution of the RF field amplitude in the resonant circuit as a function of its resonance frequency $\omega_0$, according to various sensitive coil geometries.
Figure 7:
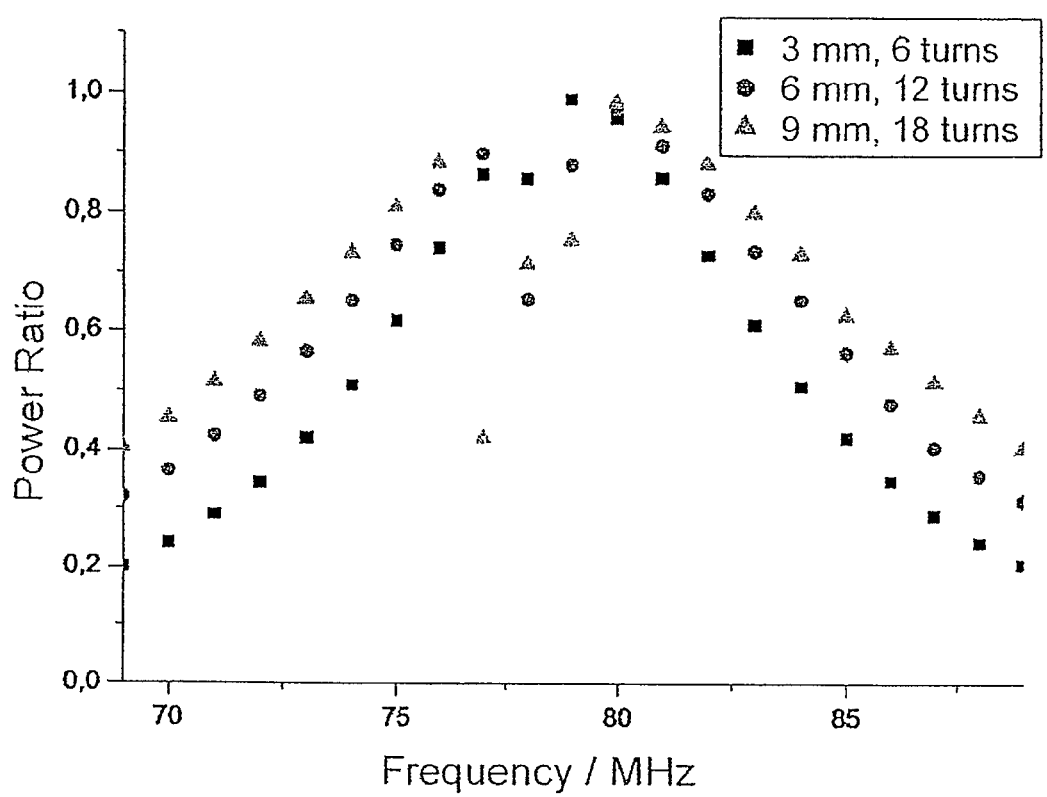
FIG. 7 is a multiple plot graph showing the evolution of the RF power dissipated in the resonant circuit over the power provided by the amplifier of the NMR probe, as a function of its resonance frequency $\omega_0$, and according to various sensitive coil geometries.

The effect of choosing this capacitance C slightly off resonance will be examined on discussing FIGS. 6 and 7 hereunder.

Figure 3:
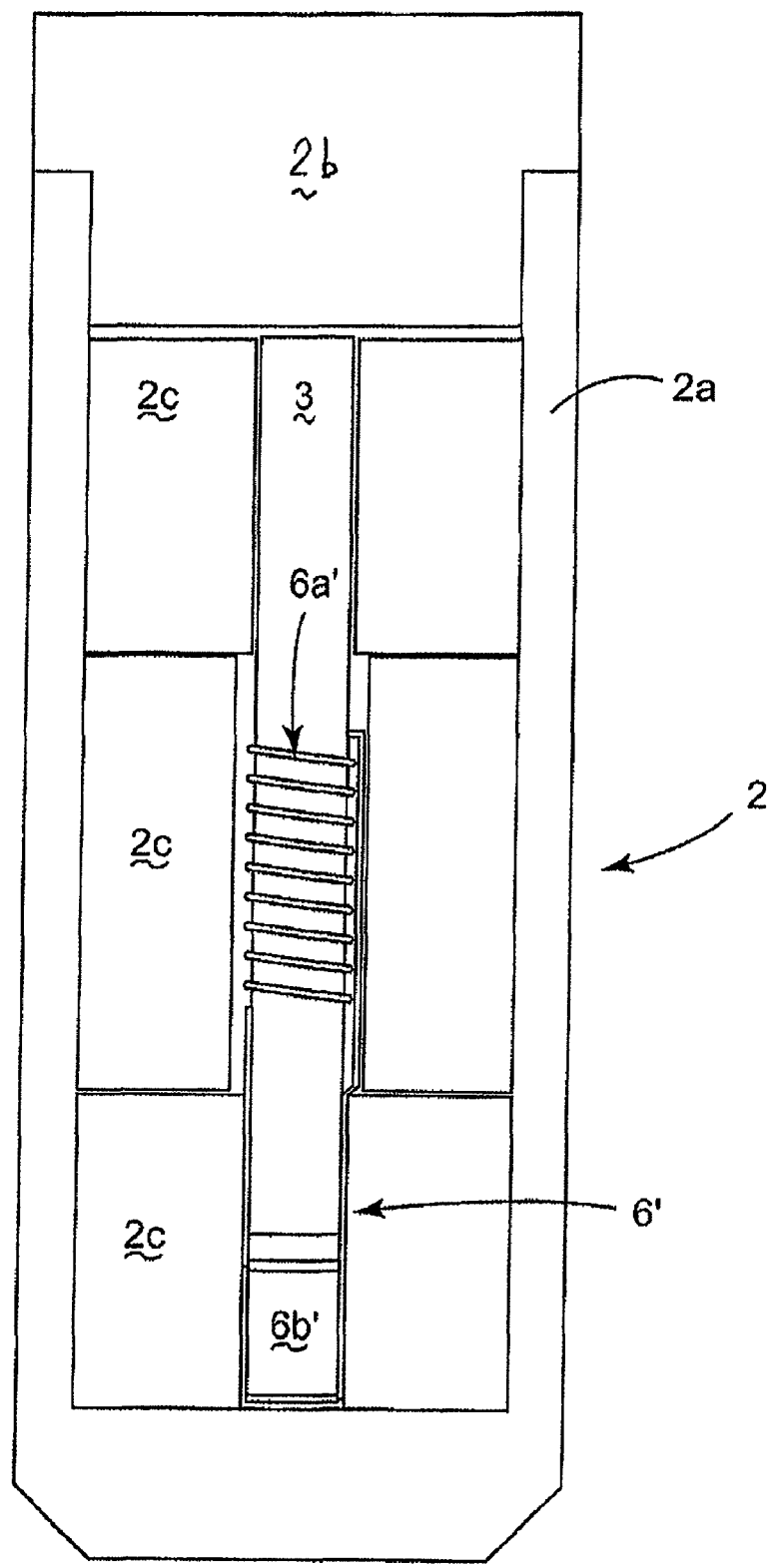
FIG. 3 is a schematic longitudinal sectional view of a rotor containing a resonant tunable circuit according to FIGS. 1b and 2b, FIG. 3' is a variant according to the invention of the rotor of FIG. 3, FIGS. 3a and 3b are respectively schematic longitudinal and transversal sectional views of a variant according to the invention of the rotor of FIG. 3, FIGS. 3c and 3d are respectively schematic longitudinal and transversal sectional views of another variant according to the invention of the rotor of FIG. 3.
Figure 3:
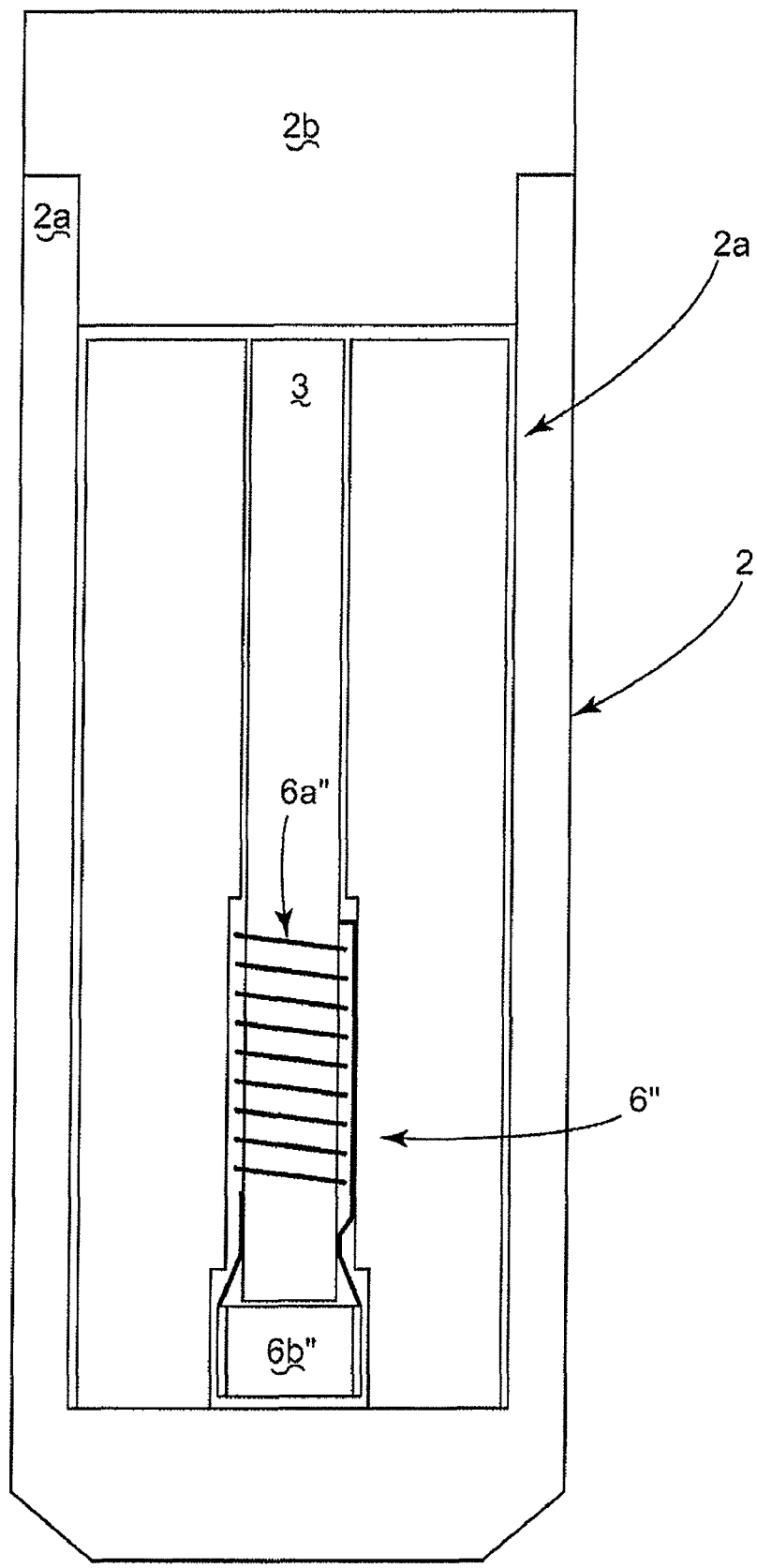

FIG. 3 shows in longitudinal section the structure of the rotor 2 containing the sensitive tuned micro-coil 6a'. It is generally used for solid state NMR. This rotor 2 comprises an outer cylindrical rotor body 2a which is provided at one end with a rotor cap 2b and, radially to the inside thereof, with a plurality of stabilization inserts 2c surrounding the capillary 3. The latter is provided on its cylindrical outer surface with the tuned micro-coil 6a' and, at one end, with the tuning capacitor 6b' which is connected thereto, its mass centre being on the symmetry axis and the plates of the capacitor 6b' being perpendicular to the cylindrical surface of the capillary 3.

As a consequence, the assembly of the capillary 3, the micro-coil 6a' and the capacitor 6b', which is placed inside the rotor 2, is well maintained along its symmetry axis thanks to the inserts 2c, which may be plastic or preferentially ceramic plugs, having the right dimensions to fit tightly these components and having high thermal conductivity. Tight fitting is indeed necessary for the stable spinning of this rotor assembly at high frequencies.

As explained above, the rotor may be positioned inside a "MAS" probe and spun as any commercial rotor. The macro-coil 5 of the "MAS" probe surrounds the rotor 2 and constitutes the energizing circuit which provides the energy for the excitation of the nuclei. A coupling constant k characterizes the strength of the coupling, or in other words the influence that each circuit has to the other one.

Even though the relative sizes in FIG. 3 are exact for a 7 mm outer diameter "Bruker" rotor 2, it will be noted that this drawing may be easily adapted to most commercial "MAS" rotors.

FIG. 3' shows in longitudinal section the structure of a rotor 2 which contains a sensitive tuned micro-coil 6a" and which only differs from that of FIG. 3 in that the capillary 3 is provided on its cylindrical outer surface with the micro-coil 6a" and, at one end, with a tuning capacitor 6b" which is connected thereto in such a manner that the plates of the capacitor 6b" are cylindrical and coaxial with the capillary 3.

Figures 3A, 3B:
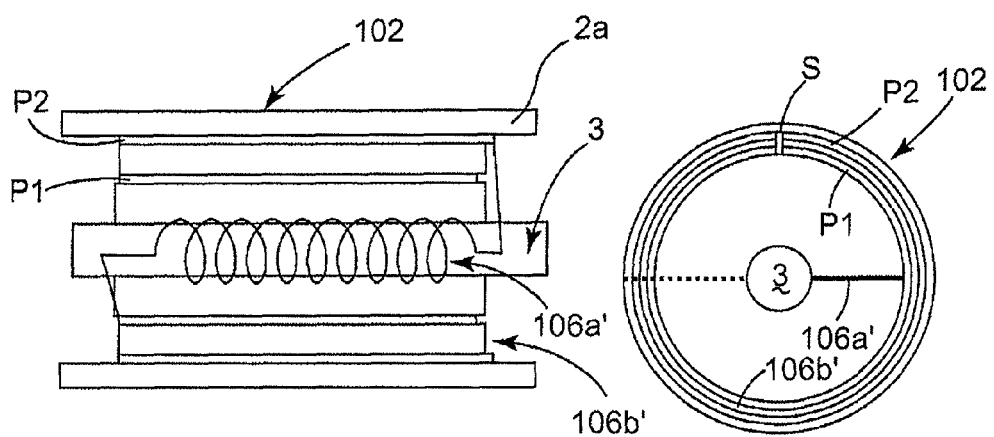
Figures 3C, 3D:
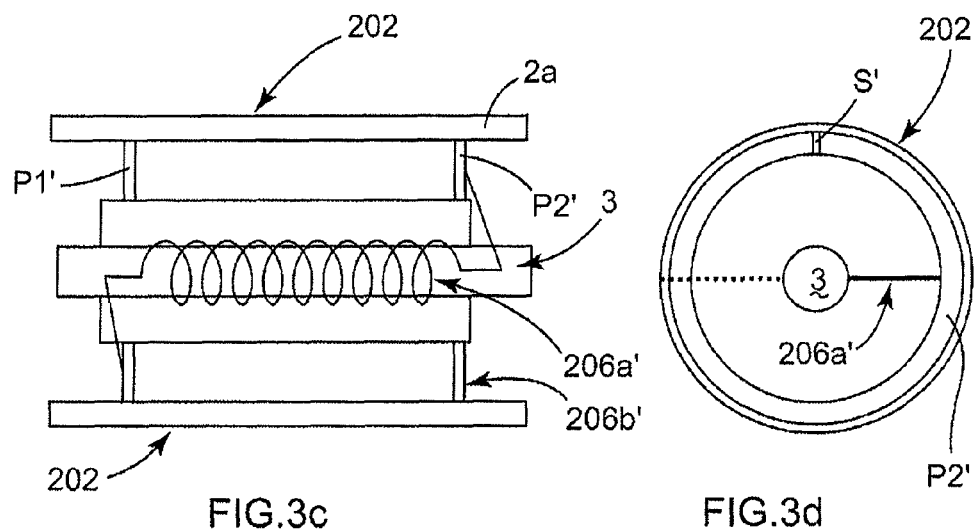

FIGS. 3a and 3b, on the one hand, and FIGS. 3c and 3d, on the other hand, are each a variant of the rotor 2 shown in FIG. 3 for an inductively coupled micro-coil 106a' or 206a'. In both variants, the capacitor 106b' or 206b' is made of a thin cylindrical film which surrounds the sensitive micro-coil 106a' or 206a'.

In the rotor 102 of FIGS. 3a and 3b, the capacitor 106b' has two concentric cylindrical plates P1 and P2 which extend parallel to the axis of the micro-coil 106a', so as to define respective inner and outer axial faces of this cylindrical film. In FIGS. 3a and 3b, the capacitor 106b' is cylindrical and surrounds the capillary 3. The leads connecting the micro-coil 106a' to the capacitor 106b' are shorter than in FIG. 3. The micro-coil 106a' is stabilized inside a solid cylinder 2a which can be a plastic insert as in FIG. 3. The thin film capacitor 106b' can be lithographied on the outer surface of this insert or on a thin surface that can be glued onto this surface. The plates P1 and P2 are slit along a generatrix by a slot S, to avoid circular Eddy currents at the radio-frequency of excitation. In a more general way, all modern micro-fabrication techniques, such as lithography, can be used to produce such capacitors 106b' and 206b'. Another preferred example is "Capton capacitors", in which a Capton thin film which is covered on both surfaces by copper.

In the rotor 202 of FIGS. 3c and 3d, the capacitor 206b' has two slit parallel annular plane plates P1' and P2' (by a slot S' along a generatrix) which extend perpendicularly to the axis of the rotor 202, so as to define respective end radial bases of this cylindrical film. This configuration allows for less metallic surfaces, less heating and smaller capacitances.

The typical size of the micro-coils 106a' or 206a' is between 10 and 1000 micrometers in diameter, while the capacitance values may vary from 0.1 to hundreds of pico-Farads.

It is to be noted that the film capacitor 106b' of FIGS. 3a and 3b allows for small capacitors having large critical voltage (useful for high-frequency nuclei), while the capacitor 206b' of FIGS. 3c and 3d allows for larger capacitors since the distance between the metal layers can be very small (a couple of micrometers).

All modern micro-fabrication techniques, such as lithography, can be used to produced such capacitors 106b' and 206b' and, as a simple example, we may calculate the capacitance from a "Capton" thin film which is covered on both surfaces by copper. Another possibility would be a thin silicon layer between two gold plated surfaces. The thin film capacitor 106b' or 206b' is then connected with the micro-coil 106a' or 206a' which is fixed along the axis of the rotor 102, 202, using incompressible solids.

These configurations of FIGS. 3a to 3d have the following advantages:

- a reduction of the leads length used for the electrical connection between the capacitor 106b', 206b' and the micro-coil 106a', 206a', reducing thus the electrical losses,
- the micro-coil 106a', 206a' wire does not need to return back to the top of the capillary 3, which reduces the radio-frequency inhomogeneity inside the sensitive volume,
- simpler sample changes since the tuned capillary 3 becomes integral part of the rotor 102, 202 and only a sample charged capillary 3 needs to be slid inside the coil volume, and
- metals having a non-null magnetic susceptibility can still be used for the micro-coil 106a', 206a' and/or the capacitor plates P1 and P2, P1' and P2', since the spinning of the assembly averages out the broadening; thus, optimized materials can be used and higher performances can be achieved.

Figure 4A:
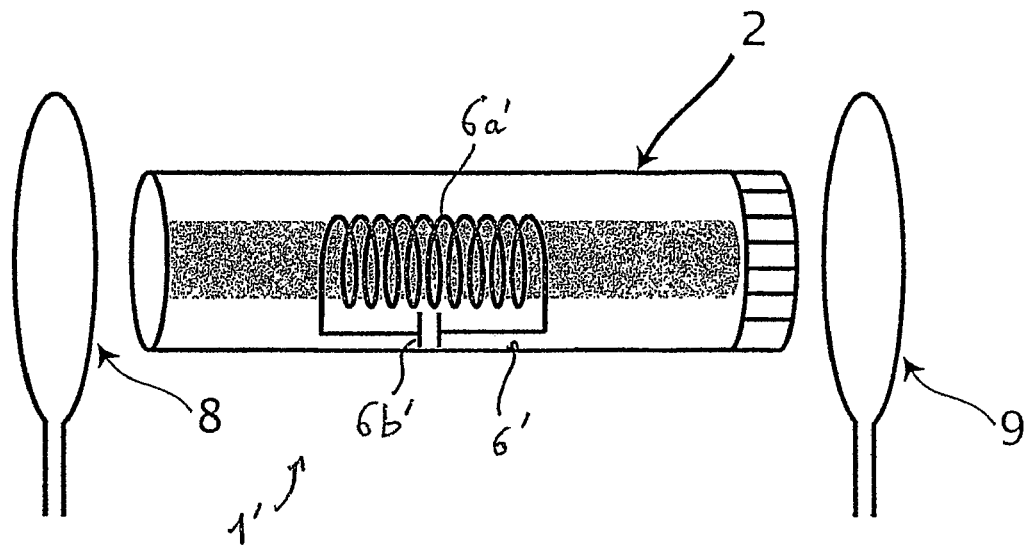
FIG. 4a is a schematic longitudinal sectional view of a rotor according to FIG. 3, whose extremities are respectively provided with two outer loops for spectrum analysis.
Figure 4B:
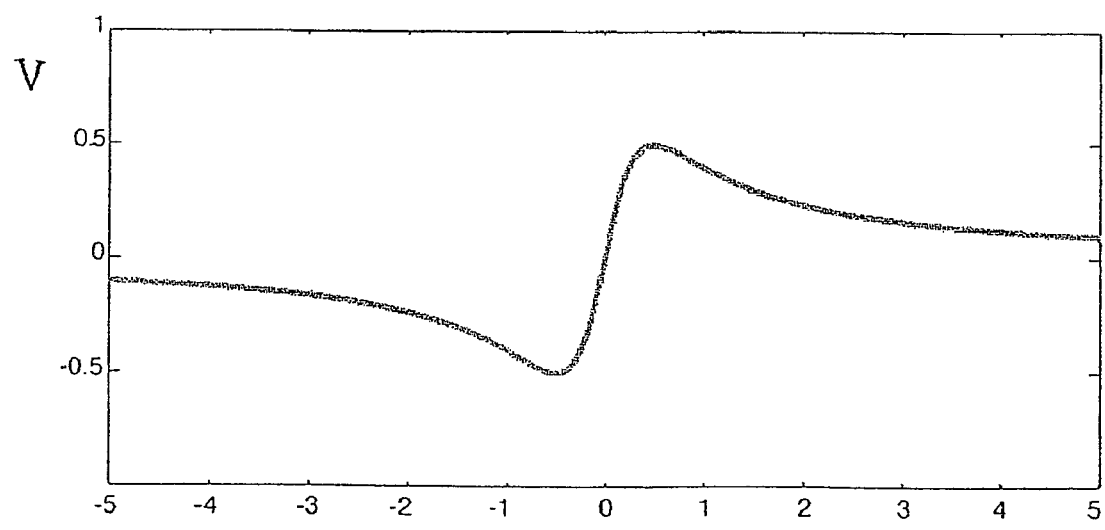
FIG. 4b is a graph showing the evolution of the response voltage V of tuned resonant circuit according to the invention, measured by a spectrum analyzer on a reduced frequency scale with set up of FIG. 4a, FIGS. 5a and 5b are respectively two exemplary schematic longitudinal sectional views of a double rotor structure relating to the "DOR" probe design, FIG. 5a relating to the prior state of the art and FIG. 5b relating to an inner tuned resonant coil according to the invention.

The tuning of the resonant circuit 6' was checked using a spectrum analyzer in the configuration shown on FIG. 4a, which shows that two outer loop coils 8 and 9 located at the respective ends of the rotor 2 were connected to a spectrum analyzer, and a dispersive Lorenzian was obtained on the screen.

The first outer loop coil 8 was driven by a current $I(t)=I_0 \exp(j\omega t)$, where $j=\sqrt{-1}$, and generated a radio-frequency field. The flux from this field in micro-coil 6a' was equal to $\Phi_{12}=M_{12} I$ and the electromotive force in the tuned circuit was then:

$$E_2(t) = -d\Phi_{12}(t)/dt = -M_{12} dI(t)/dt = -j\omega M_{12} I(t) \quad (3)$$

The impedance of the tuned circuit was $Z = R + j\omega L - j/(\omega C)$ and its current was equal to:

$$I_2 = E_2/Z = \frac{-j\omega M_{12} I(t)}{R + j[\omega L - 1/(\omega C)]} \quad (4)$$

The flux that the second outer loop coil 9 picked up from the micro-coil 6a' was $\Phi_{23} = M_{23} I_2$ and the flux of reference that the loop coil 9 picked up from the loop coil 8 was $\Phi_{13} = M_{13} I$.

Since $\Phi_{13} \gg \Phi_{23}$ what one sees on the spectrum analyzer comes from the part of $\Phi_{23}$ that is colinear with $\Phi_{13}$, that is the real part of $\Phi_{13}$:

$$\text{Real}(\Phi_{23}) = -\frac{M_{12} M_{23} \omega I [\omega L - 1/(\omega C)]}{[\omega L - 1/(\omega C)]^2 + R^2} \quad (5)$$

This is a dispersive Lorenzian function of the frequency and, on resonance, this function is equal to zero. The frequency difference between the two extreme points is equal to: $\Delta\omega/\omega = 1/Q$ and allows to measure the quality factor of the circuit.

It will be noted that the coupling between the two energizing and resonant circuits depends on the geometrical characteristics of the coils 5 and 6a' and remains constant, since the axis of the rotation is stable throughout the motion. Thus the $B_1$ field is stable and no phase distortions are expected during the signal recording.

After the resonant circuit 6' is placed inside the coil 5 of the energizing one, a coupling between them develops and the tuning frequencies for the assembly are perturbed. Adjusting the values of the tuning and matching capacitors of the static probe allows for the ensemble of the probe plus tuned micro-coil to recover 50 Ohm matching and tuning at the Larmor frequency. Generally speaking, the excitation and detection performances depend upon the characteristics of this resonant tuned circuit 6, 6'. For example, the RF amplitude can be enhanced if a much smaller coil 6a or 6a' than that of the energizing circuit is used in the resonant circuit 6 or 6'. This means that one may obtain a higher $B_1$ field in the sampling volume 3a for the same radio-frequency power. It also means that the sensitivity for the detection is higher.

The noise level is the same as having a single coil, since the set of energizing and resonant circuit 6 or 6' is tuned on resonance and matched to 50 Ohms. Thus, the signal to noise is enhanced with respect to the ordinary single coil NMR detection. Moreover, artefact signals coming from the rotation of the coil are modulated at harmonics of the spinning frequency (0-30 kHz) and are filtered electronically being very distant from the NMR frequencies (hundreds of MHz). It appears that such signals have never been observed in experiments.

Figure 5A:
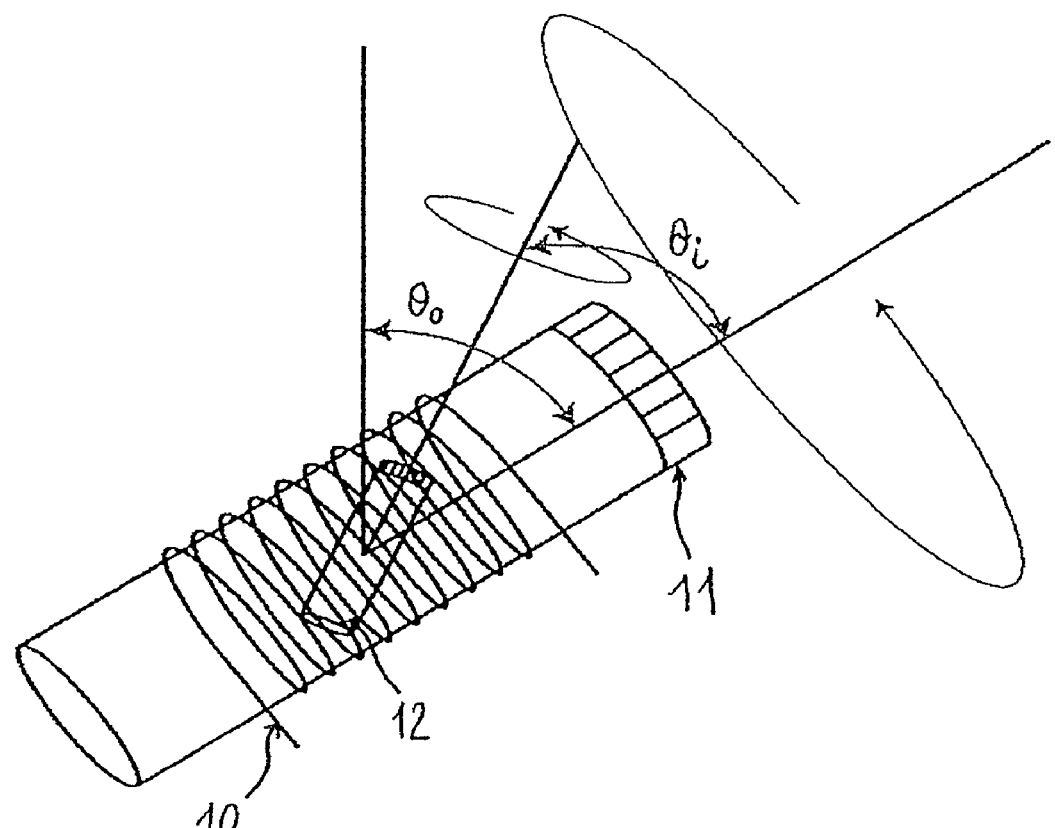
Figure 5B:
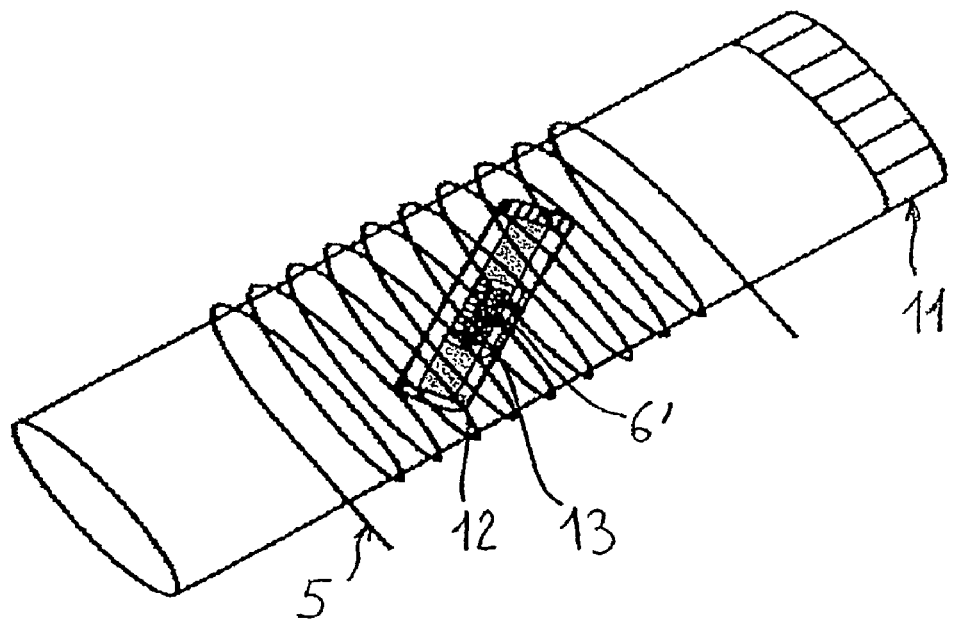

FIGS. 5a and 5b show two exemplary schematic views of a double rotor structure, according to the "DOR" NMR probe design.

In this "DOR" probe design [23, 24], two rotors are involved and, in the prior art showed in FIG. 5a, the RF coil 10 is static and surrounds the ensemble of the two rotors 11 and 12. As may be seen in FIG. 5a, there is provided a double rotor 11, 12 together with the outer coil 10 for excitation and detection. The large outer rotor 11 spins slowly around an angle $\theta_0$ of 54.7 degrees averaging the second rank interactions, while the inner rotor 12 is much smaller and spins faster to average the fourth rank interactions. The sample is placed inside the inner rotor 12. Excitation and detection are performed using the coil 10.

The best filing factor that can theoretically be obtained is 0.165, for $\theta_0=54.7$ degrees and $\theta_i=30.6$ degrees [25].

By using a tuned micro-coil 13 rotating inside the inner rotor 12, as shown in FIG. 5b, one can optimize the filling factor near unity and thus improve the sensitivity of the measurements. The excitation and detection can then take place through inductive coupling between the ordinary energizing macro-coil 5 and the rotating tuned resonant circuit 6 or 6'.

It is however to be noted that here the effective RF field is a function of time, since only the projection of the RF field along the xy plane is perpendicular to $B_0$ and effective. This component is harmonically time-dependent and splits the signal into sidebands without any severe influence in resolution or sensitivity.

FIG. 6 shows the plots of the RF field amplitude in the resonant circuit 6' as a function of its resonance frequency $\omega_0$, in order to calculate the optimum RF field produced by the sensitive coil 6a' as a function of its resonance frequency. A "MAS" apparatus 1' as shown in FIG. 1b was used in the calculations of these graphs. The excitation frequency was at Larmor frequency $\omega_L=2\pi F_L$, where $F_L=79$ MHz.

Various geometries were tested for the sensitive micro-coil 6a' and the quality factors $Q_1$ and $Q_2$ for both energizing and resonant circuits 6' were assumed equal to 100. The primary circuit is specified by solenoidal coil 7 mm in diameter, 15 mm in length having 5 turns and a quality factor of 100. The secondary circuit is characterized by a solenoidal coil 1.65 mm in diameter having a quality factor of 100. The length and the number of turns in the secondary coil are varied in the simulation and specified in the inset of FIGS. 6 and 7. The blue triangles represent the field generated by the probe coil in the absence of any micro-coil.

The down-pointed triangles plot correspond to the field produced by the main coil 5 of the energizing circuit, in the absence of any resonant circuit 6', and serves to set reference (i.e. "control") for comparison.

The three other plots correspond to various sensitive micro-coil 6a' geometries. In this calculation, the resonance frequency of the sensitive micro-coil 6a' was fixed at a certain value, and then the tuning and matching capacitors $C_M$ and $C_T$ (see FIG. 2 again) of the energizing circuit were varied, in order to maximize the RF field produced in the sensitive micro-coil 6a'. This corresponds to the procedure followed in the experiments as well.

Then, for these values of $C_M$ and $C_T$, the field in the micro-coil 6a' was calculated and placed on the curve. The calculation was repeated for all frequencies and for the micro-coil 6a' geometries shown in FIG. 6.

One may note that some points do not follow a smooth curve, which is due to the fact that inductive rather than capacitive matching elements would need to be used in the circuit of FIG. 2 in order to optimize the RF amplitude in the resonant circuit 6'.

FIG. 7 shows the plots of the ratio RF power dissipated in the resonant circuit 6' and the power provided by the amplifier, as a function of resonance frequencies for various geometries as in FIG. 6. A "MAS" apparatus 1' as shown in FIG. 1b was used in the calculations of these graphs. The excitation frequency was also at Larmor frequency $\omega_L=2\pi F_L$, where $F_L=79$ MHz.

This graph establishes that the power is mainly dissipated in the sensitive micro-coil 6a' on resonance, and this acts as an amplifier (i.e. a concentrator) for the RF field.

Examples for Manufacturing and Implementing an Apparatus According to the Present Invention:

The purpose of the following examples is to establish that the systems of inductively coupled coils according to the invention can be constructed and rotated at high spinning frequencies, and that such inventive systems provide an increase in sensitivity and in RF field amplitude.

In these examples, the resonant circuit 6' (according to FIGS. 1b and 3) was placed inside a rotor 2 (i.e. sample holder) and the assembly was either static or rotating under "MAS". The electrical connection between the static part of the probe and the rotating coils was maintained through inductive coupling with the emitting coil 5.

The filling factor was optimized by wrapping the micro-coil 6a' of the resonant circuit 6' manually around the cylindrical wall of the capillary 3. All experiments we performed using a commercial "Bruker" rotor 2 with an outer diameter of 7 mm and a "BL MAS" probe as the source of the energizing circuit, and the capillary 3 had an outer diameter of 1.4 mm.

The experiments were performed on static samples 4 and also on samples 4 rotating at 5000 Hz (within ±5 Hz accuracy). The automatic spinning module was used for the rotor 2 takeoff and spinning stabilization and landing, proving that the rotor 2 mass was correctly balanced.

Some experiments were performed using magnetic and non-magnetic chip capacitors. The connecting plates of the former contained magnetic materials, which proved to have minor line-broadening effects under "MAS". According to FIG. 3, the macroscopic magnetization of the capacitor was placed at the magic angle with respect to the sample 4 and was roughly averaged by construction.

Furthermore, it was found that the susceptibility-induced residual broadening got split into spinning sidebands upon sample spinning, thus it did not represent a major problem for the interpretation of the spectra at this stage.

It is to be noted that other versions including non-magnetic capacitors could also be used.

Figure 8:
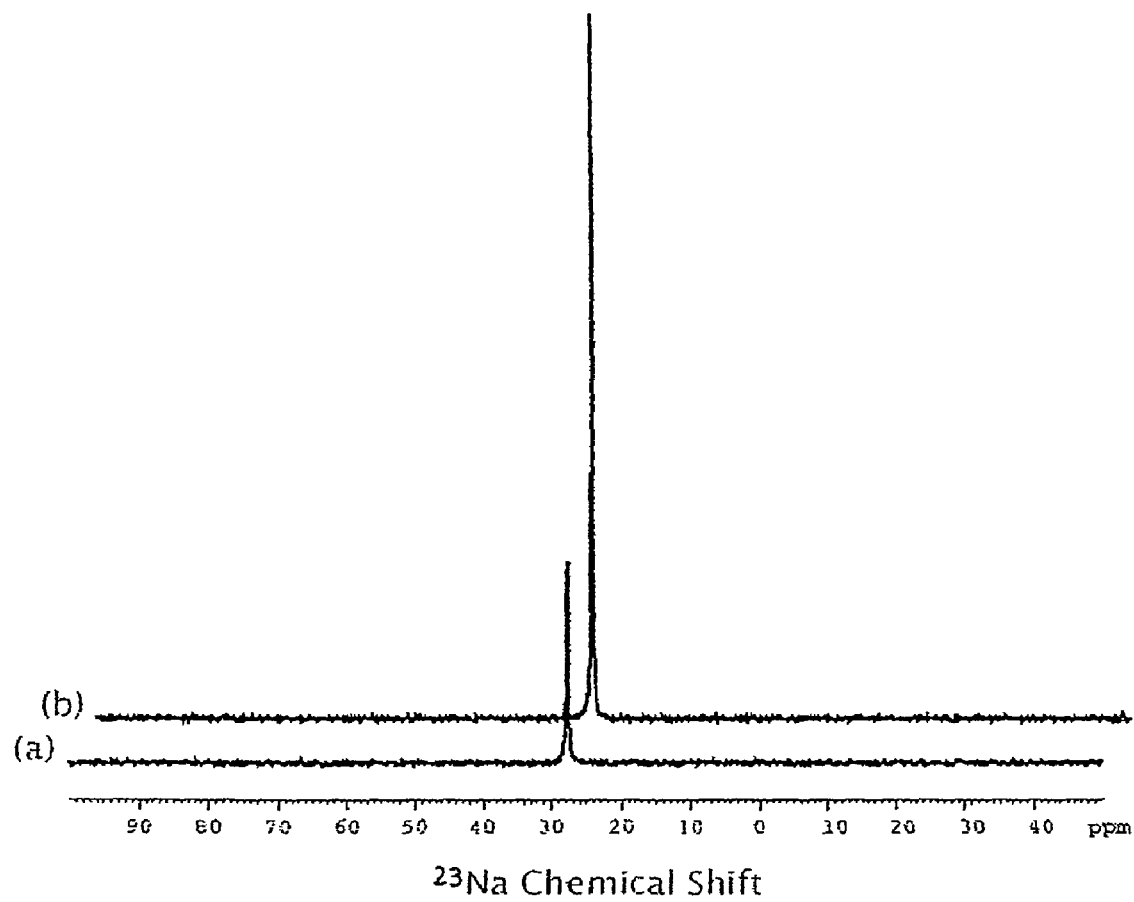
FIG. 8 illustrates a sensitivity enhancement of a liquid sample-containing capillary surrounded by said sensitive tuned coil in a static operating mode, compared to a "control" capillary being devoid thereof, by means of two respective spectra (a) and (b) plotted as a function of chemical shift.

FIG. 8 illustrates the sensitivity enhancement of a liquid sample-containing capillary 3 surrounded by the resonant tuned micro-coil 6a' in a static operating mode, compared to a "control" capillary 3 being devoid thereof.

First we calibrated the RF amplitude using the emitting coil 5 of the probe. The sensitive coil 6a' was absent. The sample was a 1M solution of NaCl and the signal from the $^{23}$Na nucleus was measured. The nutation frequency was found to be of 26 kHz and the signal to noise ratio for the $\pi/2$ spectrum was 66. A number of 8 scans were acquired, using a repetition delay of 1 second and a calibrated $\pi/2$ pulse of 9.6 µs.

The "control" spectrum of this sample is shown on the (a) plot.

Then, the resonant tuned circuit was placed around the capillary 3 and the RF amplitude was calibrated. Two non-magnetic capacitors from ATC, each having a capacitance of 33 pF, were connected in parallel and to the macro-coil. The new $\pi/2$ length was 2.6 µs and corresponded to a RF amplitude of 96 kHz, and the S/N was equal to 230. The tuning and matching of the assembly was optimized to an impedance of 50, using the wobbling utility of the "Bruker" spectrometer.

Both spectra were line-broadened by a Lorenzian of 2 Hz.

This inventive spectrum is shown on the (b) plot.

One should note that the same power level at the spectrometer amplifier (12 dB) was applied and the increase in RF amplitude was of about 3.7. The sensitivity was also enhanced by a factor 3.4, as can be seen on FIG. 8, thus proving the reciprocity relation between $B_1$ field strength and sensitivity.

The spectrum obtained using only the emitting coil 5 was compared to that obtained using the resonant circuit 6', with the same number of scans (8 scans), the same repetition time (1 second) and the same sampling volume 3a (i.e. corresponding to the sample 4 restricted in the volume that exactly fits the sensitive micro-coil 6a').

These experiments proved that inductive coupling works as a wireless mechanism to ensure excitation and detection between the two coils 5 and 6a'. They also proved that an enhancement in sensitivity and RF amplitude occurs, when the sensitive coil 6a' has a small size and an appropriate geometry (typically such that of a micro-coil).

Figure 9:
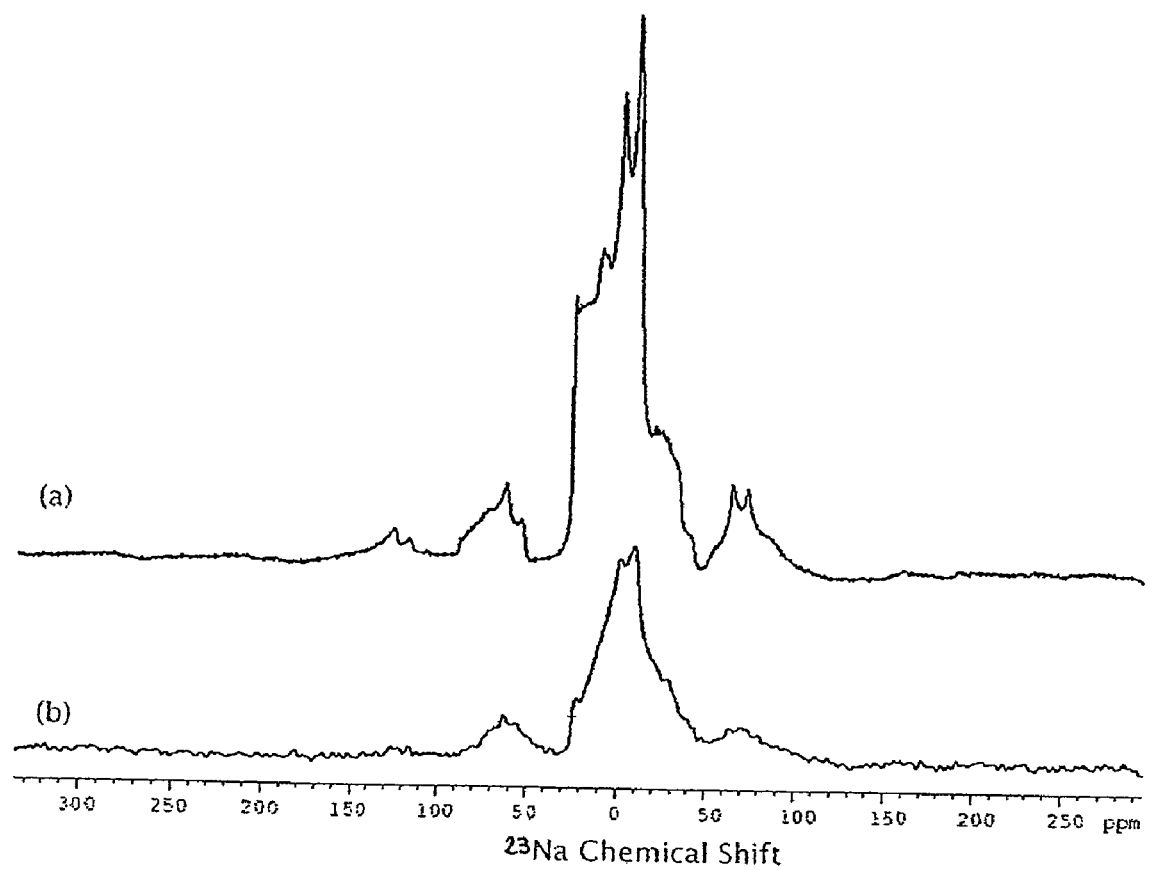
FIG. 9 illustrates a sensitivity enhancement of a solid sample-containing capillary surrounded by a sensitive tuned coil in a rotating operating mode, compared to a "control" capillary being devoid thereof, by means of two respective spectra (a) and (b) plotted as a function of chemical shift.

FIG. 9 illustrates the sensitivity enhancement of a solid sample-containing capillary 3 surrounded by a sensitive tuned coil 6a' in a rotating operating mode, compared to a "control" sample 3 being devoid thereof. $^{23}$Na NMR spectra of powder samples of $Na_2C_2O_4$ are presented.

The spectrum in (a) was obtained from a fully packed 7 mm rotor 2 containing 543.3 mg of $Na_2C_2O_4$, this rotor 2 spinning at 5 kHz. 16 scans were recorded. The calibrated π/2 pulse (selective for the central transition) was 10 μs.

The spectrum in (b) was recorded from the capillary 3 having an outer diameter of 1.4 mm containing a powder sample 4 of $Na_2C_2O_4$ of about 800 μg. For the tuned resonant circuit 6' surrounding this capillary 3, a solenoidal coil 6a' having 13 turns and a chip capacitor of 27 pF connected thereto were used. Chip capacitors from Rodenstein were used, having a size of 2 mm×1.3 mm×0.6 mm. The Q value of the resonant circuit 6' was measured to be of 79. The capacitor terminations were magnetic and the tuning (i.e. resonance) frequency measured on the spectrum analyzer was of 74 MHz. The sample 4 and the resonant circuit 6' were tightly fitted using the inserts 2c of FIG. 3, inside a 7 mm rotor 2 and spun at 5 kHz.

1024 scans were recorded using a calibrated "π/2" pulse of 1 μs. Both spectra were line-broadened by a Lorenzian of 100 Hz.

The rotation frequency was stable (within 5 Hz) over a period of 4-5 days. The tuning curve at the wobbling utility of the spectrometer was tuned and matched near to 50 Ohm at the resonance frequency of 23Na, i.e. 79.3 MHz, using the probes tuning and matching knobs. The Q value of the probe in the absence of the resonant circuit 6' was measured to be of 128 and, in the presence of the latter, to be of 85.

This long time stability allowed for two dimensional NMR experiments and, in particular, for Multiple-Quantum "MAS" [26]. Here both the excitation and conversion of the multiple quantum coherence benefit from high RF amplitudes and lead to a higher sensitivity.

Figure 10A:
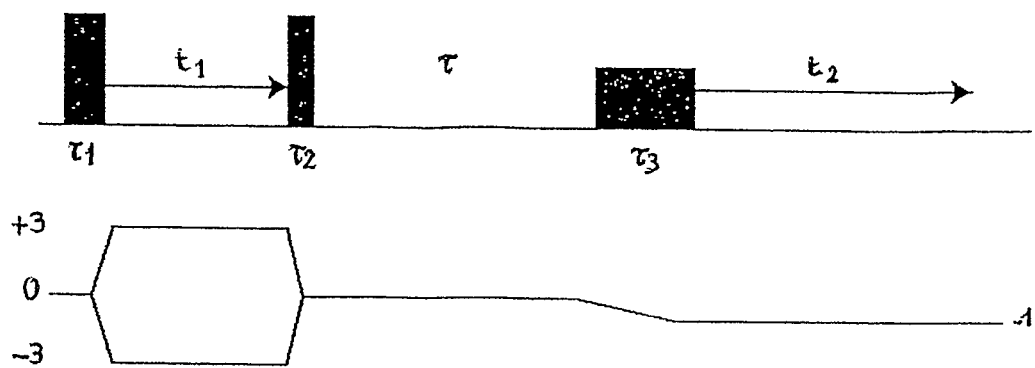
FIG. 10a is a pulse sequence which was applied to the solid state NMR apparatus including the same tuned rotating sensitive coil as used for FIG. 9.
Figure 10B:
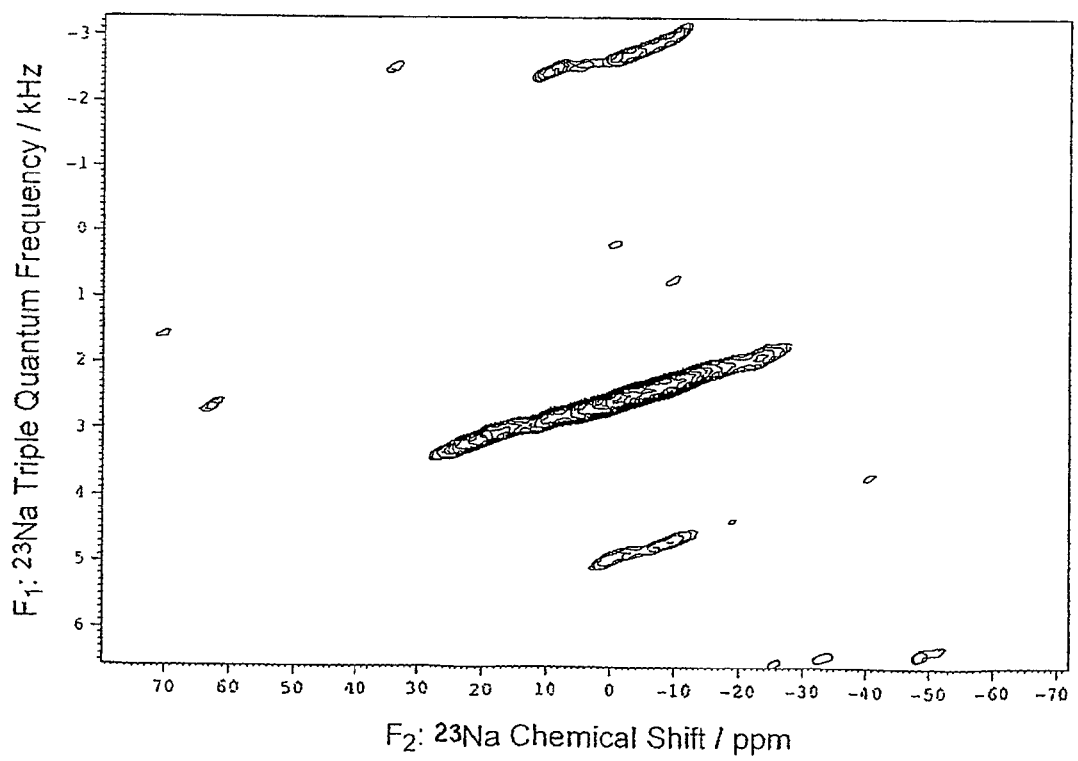
FIG. 10b is a spectrum obtained from a capillary surrounded by this tuned rotating sensitive coil.

FIG. 10 is a spectrum obtained from a capillary 3 surrounded by this tuned rotating resonant micro-coil 6a', it being a $^{23}$Na "MQ MAS" experiment. The same rotor 2-micro-coil 6a' system was used as for FIG. 9.

1152 scans per t1 increment were recorded and the spectrum was line-broadened by a Lorenzian of 250 Hz along $F_2$ and 100 Hz along $F_1$. 20 t1 increments were acquired using a recovery delay of 1 s and leading to a total experimental time of only 6.5 hours.

The pulse sequence shown in FIG. 10(a) was applied and the spectrum (b) was obtained. The pulse lengths were set to $\tau_1$=1.1 μs, $\tau_2$=3.6 μs and $\tau_3$=2.6 μs. The increment in t1 was set to 100 μs.

Figure 11A:
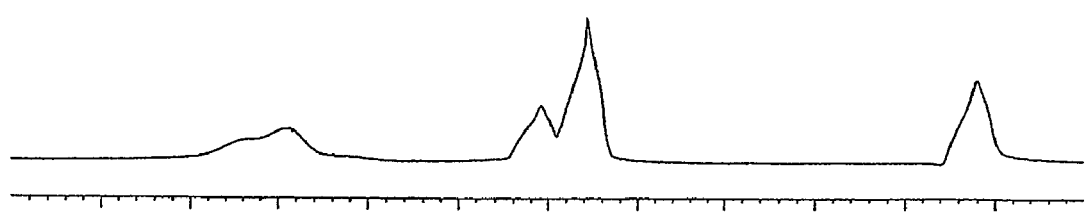
FIG. 11a is a static proton spectrum obtained inside a capillary surrounded by the self-resonant sensitive coil of an apparatus according to FIG. 1d.
Figure 11B:
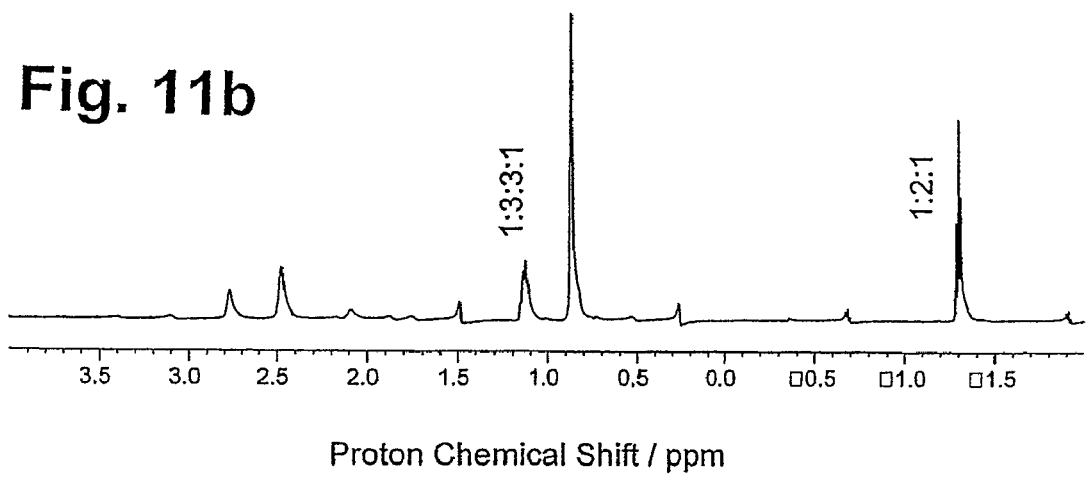
FIG. 11b is a high resolution "MAS" spectrum of the same capillary and apparatus according to FIG. 1d, obtained using a spinning of said capillary at 300 Hz.

FIGS. 11a and 11b respectively correspond to a static proton spectrum of water and alcohol inside a capillary surrounded by the solenoidal self-resonant coil 306a' of FIG. 1d and to a high-resolution "MAS" spectrum of the same capillary and micro-coil 306a' under 300 Hz of spinning.

As shown in FIG. 11a, when the sample is static, a susceptibility broadening due to the finite length of the coil 306a' is observed (in the literature [5, 22] a fluoro-inert solution is usually placed around the micro-coil 306a' and the capillary 3 in order to match the susceptibility differences and eliminate this effect). Another way to reduce this effect is the use of special many metal layer susceptibility matched wire (typically rhodium-copper) [22].

As shown in FIG. 11b, magic angle spinning eliminates the effect of susceptibility broadening. Thus, we do not need in the present invention any of those previous schemes for susceptibility matching, and a standard cooper coil or another optimized one can be used. FIG. 11b shows the high-resolution spectrum obtained using only a self-resonant micro-coil 306a' and a moderate spinning frequency (300 Hz). The linewidth is less than 2.5 Hz. The radio-frequency amplitude is of the order of 350 kHz, greatly enhanced with respect to the one delivered by the surrounding primary coil 5 (25 kHz). The signal to noise is by consequence also improved. The correct length of the micro-coil 360a', which gives the self-resonance condition, was determined experimentally. It is also to be noted that the amplitude of the radio-frequency field was a factor 14 higher than that delivered by the probe's coil 5, and that only 50 W of power from the high-power amplifier was used in this experiment.

CITED REFERENCES

[1] D. I. Hoult and R. E. Richards, The signal-to-noise ratio of the nuclear magnetic resonance experiment, J. Magn. Reson. 24, 71-85 (1976).

[2] E. R. Andrew, A. Bradbury and R. G. Eades, Nuclear magnetic resonance spectra from a crystal rotated at high speed, Nature 182, 1659 (1958).

[3] A. Samoson, E. Lippmaa and A. Pines, High resolution solid-state NMR averaging of second-order effects by means of a double-rotor, Molecular Physics 65, 1013-1018 (1988).

[4] A. Llor and J. Virlet, Towards high-resolution NMR of more nuclei in solids: Sample spinning with time-dependent spinner axis angle, Chem. Phys. Lett. 152, 248-253 (1988).

[5] D. L. Olson, T. L. Peck, A. G. Webb, R. L. Magin and J. V. Sweedler, High-resolution microcoil 1H-NMR for mass-limited, nanoliter-volume samples, Science 270, 1967-1970 (1995).

[6] R. Subramanian, M. M. Lam and A. G. Webb, Rf microcoil design for practical NMR of mass-limited samples, J. Magn. Reson. 133, 227-231 (1998).

[7] K. R. Minard and R. A. Wind, Picoliter 1H NMR spectroscopy, J. Magn. Reson. 154, 336-343 (2002).

[8] K. Yamauchi, J. W. G. Jannsen and A. P. M. Kentgens, Implementing solenoid microcoils for wide-line solid-state NMR, J. Magn. Reson. 167, 87-96 (2004).

[9] D. I. Hoult, Tuning and matching an impedance. U.S. Pat. No. 6,107,798, issued August 2000 (2000).

[10] D. I. Hoult and B. Tomanek, Use of mutually inductive coupling in probe design, Concepts in Magnetic Resonance B 15, 262-285 (2002).

[11] A. Raad and L. Darrasse, Optimization of NMR receiver bandwidth by inductive coupling, Magn. Reson. Imag. 10, 55-65 (1992).

[12] M. D. Schnall, C. Barlow, V. H. Subramanian and J. S. J. Leigh, Wireless implanted magnetic resonance probes for in vivo NMR, J. Magn. Reson. 68, 161-167 (1986).

[13] I. Farnan, H. Cho, W. J. Weber, R. D. Scheele, N. R. Jahnson and A. E. Kozelisky, High-resolution solid-state nuclear magnetic resonance experiments oh highly radioactive ceramics, Rev. Sci. Intrum. 75, 5232-5236 (2004).

[14] F. E. Terman, "Electronic and radio engineering" Electrical and Electronic Engineering Series McGraw-Hill (1955).

[15] D. A. Seeber, R. L. Cooper, L. Ciobanu and C. H. Pennington, Design and testing of high sensitivity microreceiver coil apparatus for nuclear magnetic resonance and imaging, Rev. Sci. Instrum. 72, 2171-2179 (2001).

[16] K. R. Minard and R. A. Wind, Solenoidal microcoil design. Part I: Optimizing RF homogeneity and coil dimensions, Concepts in Magnetic Resonance 13, 128-142 (2001).

[17] K. R. Minard and R. A. Wind, Solenoidal microcoil design. Part II: Optimizing winding parameters for maximum signal-to-noise performance, Concepts in Magnetic Resonance 13, 190-210 (2001).

[18] J. V. Sweedler, T. L. Peck, A. G. Webb, R. L. Magin and N. Wu, Method and apparatus for NMR spectroscopy of nanoliter volume samples. U.S. Pat. No. 5,654,636, issued Aug. 5, 1997 (1997).

[19] J. V. Sweedler, R. L. Magin, T. L. Peck and A. G. Webb, Microcoil based micro-NMR spectrometer and method. U.S. Pat. No. 6,097,188, issued Aug. 1, 2000 (2000).

[20] J. V. Sweedler, R. L. Magin, T. L. Peck and A. G. Webb, Microcoil based micro-NMR spectrometer and method. U.S. Pat. No. 6,788,061, issued Sep. 7, 2004 (2004).

[21] A. Samoson, T. Tuherm and Z. Gan, High-field high-speed MAS resolution enhancement in 1H NMR spectroscopy of solids, Solid State Nuclear Magnetic Resonance 20, 130-136 (2001).

[22] Webb, A. G., <<Radiofrequency microcoils in magnetic resonance>>, Progress in NMR Spectroscopy, 1-42, 31, (1997).

[23] A. Pines and A. Samoson, Probe for high resolution NMR with sample reorientation U.S. Pat. No. 4,899,111, issued Feb. 6, 1990 (1990).

[24] A. Llor, Turbine having a rotor forming a nutation and precession movement. U.S. Pat. No. 5,159,271, issued October 1992 (1992).

[25] A. Samoson and A. Pines, Double rotor for solid-state NMR, Rev. Sci. Instrum. 60, 3239-3241 (1989).

[26] A. Medek, J. S. Harwood and L. Frydman, Multiple-quantum magic-angle spinning NMR: A new method for the study of quadrupolar nuclei in solids, J. Am. Chem. Soc. 117, 12779-12787 (1995).

The invention claimed is:

1. Apparatus configured for liquid or solid state NMR spectroscopy and/or NMR imaging of at least one sample, comprising:
at least one sample container comprising a sampling volume which is designed to be filled by said at least one sample and to be subjected to an electromagnetic radio frequency field, and
a static probe comprising an energizing circuit configured for excitation of nuclei of said at least one sample by generating an incident radio frequency field at the Larmor frequency of said nuclei, and said circuit being configured for reception of a return radio frequency field emitted by said at least one sample, said apparatus comprising at least one sensitive coil which is mounted closely around or in contact with said sample container and which is wirelessly coupled to said static probe by an electromagnetic radio frequency field, and in that said sensitive coil defines a sensing volume which is substantially equal to said sampling volume,
wherein said sensitive coil is completely embedded inside an inner spinning rotor which is rotatively mounted inside said static probe and which is integral with said sample container, so that both the filling factor and the radio frequency field amplitude received by said sensitive coil are maximized.

2. Apparatus according to claim 1, wherein said electromagnetic radio frequency field is a radio frequency magnetic field.

3. Apparatus according to claim 2, wherein it also comprises at least one resonant circuit configured for detection of precession frequencies of said nuclei, which is electromagnetically coupled to said static probe so as to be tunable thereto substantially at the Larmor frequency of said nuclei, and which comprises said at least one sensitive coil mounted within an emitting coil of said energizing circuit.

4. Apparatus according to claim 1, wherein said at least one sensitive coil is rotatively mounted inside said static probe and is embedded in said inner rotor which is integral with said sample container and said sensitive coil.

5. Apparatus according to claim 4, wherein said inner rotor includes a plurality of radioactive protective barrier layers which are provided around said at least one sample container.

6. Apparatus according to claim 4, wherein it further comprises an outer rotor which surrounds said inner rotor and which rotates at a slower frequency than that of the latter, so as to allow a simultaneous double rotation.

7. Apparatus according to claim 3, wherein the apparatus is operated under conditions meeting the following equation:

$$V2 > V1/(Q1 \cdot Q2),$$

wherein: Q1 is a quality factor of said static probe;
Q2 is an expected quality factor of said resonant circuit,
V1 is the volume in which said radio frequency field is generated by said static probe; and
V2 is said sensing volume.

8. Apparatus according to claim 1, wherein said at least one sensitive coil is a micro-coil having a diameter between 100 µm and 1500 µm.

9. Apparatus according to claim 1, wherein said at least one sensitive coil has a length of between 1 mm and 20 mm and a number of turns ranging from 1 to 20.

10. Apparatus according to claim 3, wherein said emitting coil and said at least one sensitive coil are solenoids.

11. Apparatus according to claim 1, wherein said at least one sample container is a capillary on the surface of which said at least one sensitive coil is mounted.

12. Apparatus according to claim 3, wherein said resonant circuit is inductively coupled to said energizing circuit.

13. Apparatus according to claim 12, wherein said resonant circuit further comprises at least one capacitor which is connected to the terminals of said at least one sensitive coil.

14. Apparatus according to claim 13, wherein said capacitor comprises a thin cylindrical film which surrounds said sensitive coil.

15. Apparatus according to claim 14, wherein said capacitor has two concentric cylindrical plates which extend parallel to the axis of said sensitive coil, so as to define respective inner and outer axial faces of said cylindrical film.

16. Apparatus according to claim 14, wherein said capacitor has two parallel annular plane plates which extend perpendicularly to the axis of said sensitive coil, so as to define respective end radial bases of said cylindrical film.

17. Apparatus according to claim 11, wherein said resonant circuit consists of said sensitive coil, which is made of one or several self-resonant micro-coil(s), in order to perform spectroscopy of high gamma nuclei.

18. Apparatus according to claim 17, wherein said sensitive coil is made of one self-resonant solenoidal micro-coil.

19. Apparatus according to claim 17, wherein said sensitive coil is made of a self-resonant plurality of concentric metal rings which are axially spaced around said capillary along the axis thereof.

20. Apparatus according to claim 12, wherein said resonant circuit comprises a plurality of sensitive coils arranged to define at least one tank circuit, so that said resonant circuit is tunable to said static probe at multiple Larmor frequencies in order to perform analysis of multiple types of nuclei at the same time.

21. Apparatus according to claim 20, wherein said resonant circuit is a double frequency-tunable one comprising two sensitive coils, one of which is series connected to said tank circuit including the other one.

22. Apparatus according to claim 1, wherein said electromagnetic radio frequency field is a radio frequency electrical field.

23. Apparatus according to claim 22, wherein two input and output capacitors are series connected with said sensitive coil, so that said radio frequency electrical field passes through said capacitors.

24. Apparatus according to claim 23, wherein each of said input and output capacitors is made of a static cylindrical plate which is mechanically linked to said static probe and of a rotating cylindrical plate which is mechanically linked to said sensitive coil and embedded in said sample container close to the corresponding end thereof, each of said capacitors having the same symmetry axis than that of said sample container.

25. Apparatus according to claim 24, wherein the two plates of each input and output capacitor are concentric in such a manner that each static plate surrounds said rotor incorporating each rotating plate.

26. Apparatus according to claim 24, wherein the two plates of each input and output capacitors are parallel and axially spaced along said symmetry axis, in such a manner that each static plate is located axially outside said rotor incorporating each rotating plate.

27. Method for solid or liquid state NMR spectroscopy and/or NMR imaging of at least one sample which uses an apparatus comprising at least one sensitive coil which is mounted closely around said sample and defines a sensing volume being substantially filled by said sample, said method comprising:
    subjecting to an electromagnetic radio frequency field said sample which fills a sample container, and
    excitating nuclei of said sample by an electromagnetic radio frequency field by generating a incident radio frequency field at the Larmor frequency of said nuclei, and receiving a return radio frequency field emitted by said sample, this excitation and reception being accomplished by an energizing circuit of a static probe of said apparatus, said at least one sensitive coil being wireless coupled to said static probe by an electromagnetic radio frequency field,
    wherein it also comprises spinning an inner rotor in which said at least one sensitive coil is completely embedded inside and which thus spins inside said static probe and which is integral with said sample container, so that both the filling factor and the radio frequency field amplitude received by said sensitive coil are maximized.

28. Method according to claim 27, wherein said electromagnetic radio frequency field is a radio frequency magnetic field.

29. Method according to claim 28, wherein it comprises an electromagnetic coupling to said energizing circuit of at least one resonant circuit comprising said at least one sensitive coil within an emitting coil of said energizing circuit, said resonant circuit detecting the precession frequencies of said nuclei and being tuned to said energizing circuit substantially at the Larmor frequency of said nuclei.

30. Method according to claim 27, wherein said electromagnetic radio frequency field is a radio frequency electrical field.

31. Method according to claim 27, wherein said at least one sample is a static or rotating solid one.

32. Method according to claim 27, wherein said at least one sensitive coil spins in a continuous way at a spinning frequency of at least 1 Hz.

33. Method according to claim 29, wherein said at least one resonant circuit spins inside said static probe at a spinning frequency greater than 1 kHz.

34. Method according to claim 33, wherein said spinning frequency ranges from 3 kHz to 35 kHz.

35. Method according to claim 33, wherein it comprises rotating said at least one resonant circuit by means of an inner rotor, using a technique selected from the group consisting of the Magic Angle Sample Spinning technique ("MAS"), the Double Rotation technique ("DOR") and the Double Angle Spinning technique ("DAS").

* * * * *